(12) United States Patent
Eroz et al.

(10) Patent No.: US 7,424,662 B2
(45) Date of Patent: *Sep. 9, 2008

(54) METHOD AND SYSTEM FOR PROVIDING LOW DENSITY PARITY CHECK (LDPC) ENCODING

(75) Inventors: Mustafa Eroz, Germantown, MD (US); Feng-Wen Sun, Germantown, MD (US); Lin-Nan Lee, Potomac, MD (US)

(73) Assignee: The DIRECTV Group, Inc., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/635,998

(22) Filed: Dec. 8, 2006

(65) Prior Publication Data

US 2007/0113142 A1    May 17, 2007

Related U.S. Application Data

(63) Continuation of application No. 10/613,823, filed on Jul. 3, 2003, now Pat. No. 7,191,378.

(60) Provisional application No. 60/393,457, filed on Jul. 3, 2002, provisional application No. 60/398,760, filed on Jul. 26, 2002, provisional application No. 60/403,812, filed on Aug. 15, 2002, provisional application No. 60/421,505, filed on Oct. 25, 2002, provisional application No. 60/421,999, filed on Oct. 29, 2002, provisional application No. 60/423,710, filed on Nov. 4, 2002, provisional application No. 60/440,199, filed on Jan. 15, 2003, provisional application No. 60/447,641, filed on Feb. 14, 2003, provisional application No. 60/469,356, filed on May 9, 2003, provisional application No. 60/456,220, filed on Mar. 20, 2003, provisional application No. 60/482,112, filed on Jun. 24, 2003, provisional application No. 60/482,107, filed on Jun. 24, 2003.

(51) Int. Cl.
*H03M 13/00* (2006.01)

(52) U.S. Cl. ............... 714/758; 714/805; 714/800; 714/782; 375/329; 375/308; 375/303; 375/323; 375/298; 375/261; 375/269; 375/279

(58) Field of Classification Search ............... 714/777, 714/704, 797–791, 774, 758, 760, 782, 784; 375/262, 265, 341

See application file for complete search history.

(56) References Cited

U.S. PATENT DOCUMENTS

| 5,099,484 A | 3/1992 | Smelser |
| 5,559,990 A | 9/1996 | Cheng et al. |

(Continued)

FOREIGN PATENT DOCUMENTS

JP    7-050598    2/1995

(Continued)

OTHER PUBLICATIONS

Sho Wadayama; "Low Density Parity Check Code and Decoding Method"; Tokyo Japan; Jun. 5, 2002; Triceps Corporation; pp. 123-131; ISBN4-88657-222-7.

(Continued)

*Primary Examiner*—Guy J. Lamarre

(57) ABSTRACT

An approach is provided for a method of encoding structure Low Density Parity Check (LDPC) codes. Memory storing information representing a structured parity check Matrix of Low Density Parity Check (LDPC) codes is accessed during the encoding process. The information is organized in tabular form, wherein each row represents occurrences of one Values within a first column of a group of columns of the parity check matrix. The rows correspond to groups of columns of the parity check matrix, wherein subsequent columns within each of the groups are derived according to a predetermined operation. An LDPC coded signal is output based on the stored information representing the parity check matrix.

22 Claims, 17 Drawing Sheets

U.S. PATENT DOCUMENTS

| | | | |
|---|---|---|---|
| 6,075,408 | A | 6/2000 | Kullstam et al. |
| 6,097,703 | A | 8/2000 | Larsen et al. |
| 6,347,124 | B1 | 2/2002 | Antia et al. |
| 6,510,536 | B1 | 1/2003 | Crozier et al. |
| 6,518,892 | B2 | 2/2003 | Shen et al. |
| 6,539,367 | B1 | 3/2003 | Blanksby et al. |
| 6,553,535 | B1 | 4/2003 | Asada et al. |
| 6,567,465 | B2 | 5/2003 | Goldstein et al. |
| 6,633,856 | B2 | 10/2003 | Richardson et al. |
| 6,662,290 | B2 | 12/2003 | Choi |
| 6,662,337 | B1 | 12/2003 | Brink |
| 6,665,361 | B1 | 12/2003 | Christodoulides et al. |
| 6,715,121 | B1 | 3/2004 | Laurent |
| 6,718,508 | B2 | 4/2004 | Lodge et al. |
| 6,751,770 | B2 | 6/2004 | Morelos-Zaragoza |
| 6,857,097 | B2 | 2/2005 | Yedidia et al. |
| 6,895,546 | B2 | 5/2005 | Eleftheriou et al. |
| 6,901,119 | B2 | 5/2005 | Cideciyan et al. |
| 6,938,196 | B2 | 8/2005 | Richardson et al. |
| 6,950,461 | B2 | 9/2005 | Goldstein et al. |
| 6,963,622 | B2 | 11/2005 | Eroz et al. |
| 7,000,177 | B1 | 2/2006 | Wu et al. |
| 7,017,106 | B2 | 3/2006 | Shen et al. |
| 7,116,710 | B1 | 10/2006 | Jin et al. |
| 7,184,486 | B1 | 2/2007 | Wu et al. |
| 7,191,378 | B2 * | 3/2007 | Eroz et al. .................. 375/298 |
| 2002/0002695 | A1 | 1/2002 | Kschischang et al. |
| 2002/0021770 | A1 | 2/2002 | Beerel et al. |
| 2002/0042899 | A1 | 4/2002 | Tzannes et al. |
| 2002/0048329 | A1 | 4/2002 | Tran et al. |
| 2002/0051499 | A1 | 5/2002 | Cameron et al. |
| 2002/0051501 | A1 | 5/2002 | Demjanenko et al. |
| 2002/0071504 | A1 | 6/2002 | Chen et al. |
| 2002/0101915 | A1 | 8/2002 | Zhang et al. |
| 2002/0136317 | A1 | 9/2002 | Oelcer et al. |
| 2002/0136318 | A1 | 9/2002 | Gorokhov et al. |
| 2002/0150167 | A1 | 10/2002 | Demjanenko et al. |
| 2002/0153938 | A1 | 10/2002 | Baudelot et al. |
| 2002/0188906 | A1 | 12/2002 | Kurtas et al. |
| 2003/0014718 | A1 | 1/2003 | De Souza et al. |
| 2003/0023917 | A1 | 1/2003 | Richardson et al. |
| 2003/0033570 | A1 | 2/2003 | Khannanov et al. |
| 2003/0033575 | A1 | 2/2003 | Richardson et al. |
| 2003/0037298 | A1 | 2/2003 | Eleftheriou et al. |
| 2003/0058958 | A1 | 3/2003 | Shokrollahi et al. |
| 2003/0065989 | A1 | 4/2003 | Yedida et al. |
| 2003/0074626 | A1 | 4/2003 | Coker et al. |
| 2003/0079171 | A1 | 4/2003 | Coe |
| 2003/0079172 | A1 | 4/2003 | Yamagishi et al. |
| 2003/0081691 | A1 | 5/2003 | Sutskover et al. |
| 2003/0104788 | A1 | 6/2003 | Kim |
| 2003/0126551 | A1 | 7/2003 | Mantha et al. |
| 2003/0152158 | A1 | 8/2003 | Torres et al. |
| 2003/0179768 | A1 | 9/2003 | Lusky et al. |
| 2003/0187899 | A1 | 10/2003 | Ohta |
| 2003/0203721 | A1 | 10/2003 | Berezdivin et al. |
| 2003/0223507 | A1 | 12/2003 | De Gaudenzi et al. |
| 2004/0034827 | A1 | 2/2004 | Shen et al. |
| 2004/0034828 | A1 | 2/2004 | Hocevar |
| 2004/0039983 | A1 | 2/2004 | Brossier et al. |
| 2004/0047433 | A1 | 3/2004 | Mogre et al. |
| 2004/0064779 | A1 | 4/2004 | Vasic et al. |
| 2004/0093554 | A1 | 5/2004 | Hung |
| 2004/0098659 | A1 | 5/2004 | Bjerke et al. |
| 2005/0005231 | A1 | 1/2005 | Sun et al. |
| 2005/0063484 | A1 | 3/2005 | Eroz et al. |
| 2005/0278606 | A1 | 12/2005 | Richardson et al. |

FOREIGN PATENT DOCUMENTS

| | | |
|---|---|---|
| JP | 2002-094405 | 3/2002 |
| WO | WO 02/099976 | 12/2002 |
| WO | WO 02/103631 | 12/2002 |
| WO | WO 03/065591 | 8/2003 |
| WO | WO 03/088504 | 10/2003 |

OTHER PUBLICATIONS

Eleftheriou, E.; "G:gen: LDPC Codes for G.dmt.bis and G.lite.bis"; Jan. 2001; http://www.stanford.edu/class/ee379b/class_reader/ibm3.pdf.

Meglicki; "Linear Codes"; Apr. 2005; http://www.beige.ucs.indiana.edu/M743/node119.html.

Al-Rawi, Ghazi. et al.; "Optimizing the Mapping of Low-Density Parity Check Codes on Parallel Decoding Architectures"; Proceedings, IEEE Conference on Information Technology: Coding and Computing; pp. 578-586; Apr. 2-4, 2001.

Boutillon, Emmanuel et al, "Decoder-First Code Design", 2$^{nd}$ International Symposium on Turbo Codes & Related Topics, Brest, France, 2000, XP008011934.

Boutros, J. et al.; "Generalized Low Density (Tanner) Codes"; 1999 IEEE International Conference on Communications; vol. 1; Jun. 6-10, 1999; pp. 441-445.

Brink, S. Ten et al.; "Iterative Demapping for QPSK Modulation"; Electronics Letters; IEE Stevenage; United Kingdom; vol. 34, No. 15, Jul. 23, 1998; pp. 1459-1460.

Chen, Yanni et al.; "High Throughput Overlapped Message Passing for Low Density Parity Check Codes"; GLSVLSI '03; Apr. 28-29, 2003.

Duman, Tolga M. et al, "Performance Bounds for Turbo-Coded Modulation Systems", Transactions Papers, XP002263494, 1999 IEEE, pp. 511-521.

Echard, Rich et al.; "The π-Rotation Low-Density Parity Check Codes"; 2001 IEEE; XP-001099251.

Eleftheriou, E. et al, "Low-Density Parity-Check Codes for Digital Subscriber Lines", IBM Research Zurich Research Laboratory, Switzerland, 2002 IEEE, pp. 1752-1757.

"Flarion Improves Speed for Data Communications and Multimedia Applications with Enhanced Forward Error-Correction Codes", Press Releases, Feb. 19, 2002, http://www.flarion.com/news/pr_2002/021902.asp.

Flarion Technologies, Inc.; "Vector-LDPC Coding Solution Data Sheet"; www.flarion.com, 2004.

Futaki, Hisashi et al, "Performance of Low-Density Parity-Check (LDPC) Coded OFDM Systems"; Tokyo University of Science, Faculty of Science and Technology, Tokyo University of Science, Japan, 2000 IEEE, pp. 1696-1700.

Gallagher, R.G.; "Low-Density Parity Check Codes"; IRE Transactions of Information Theory; 1962; pp. 21-28; XP-000992693.

Hagenauer, Joachim et al.; "Iterative Decoding of 6-8 Binary Block and Convolutional Codes"; IEEE Transactions on Information Theory; vol. 47, No. 2; Mar. 1996; pp. 429-445.

Hagenauer, Joachim et al.; "Decoding and Equalization with Analog Non-Linear Networks"; European Transactions on Telecommunications; Eurel Publication; Milano, Italy; Nov. 6, 1999; pp. 659-680.

Johnson, Sarah J. et al.; "Construction of Low-Density Parity-Check Codes from Kirkman Triple Systems"; Proceedings, IEEE Global Telecommunications Conference 2001; pp. 970-974; Nov. 25-29, 2001.

Le Goff, S.Y., "Channel Capacity of Bit-Interleaved Coded Modulation Schemes Using 8-ary Signal Constellations", Electronics Letters, Feb. 14, 2002, vol. 28, No. 4.

Le Goff, Stephane Y.; "Signal Constellations for Bit-Interleaved Coded Modulation"; IEEE Transactions on Information Theory; vol. 49, No. 1; Jan. 2003; pp. 307-313.

Li, Xiaodong et al, "Bit-Interleaved Coded Modulation with Iterative Decoding Using Soft Feedback", Electronics Letters, May 14, 1998, vol. 34, No. 10.

Li, X. et al.; "Trellis-Coded Modulation with Bit Interleaving and Iterative Decoding"; IEEE Journal on Selected Areas in Communications; IEEE, Inc.; New York, U.S.; vol. 17, No. 4; Apr. 1999; pp. 715-724; XP000824314.

Mackay, David J.C.; "Good Error-Correcting Codes Based on Very Sparse Matrices"; IEEE Transaction on Information Theory; vol. 45, No. 2; Mar. 1999; pp. 399-431; XP-002143042.

Mansour, Mohammad M. et al.; "Low-Power VLSI Decoder Architectures for LDPC Codes", Proceedings, IEEE International Symposium on Lower Power Electronics and Design; ISLPED '02; pp. 284-289; Aug. 12-14, 2002.

Narayanan, K.R. et al, "Bandwidth Efficiency Low Density Parity Check Coding Using Multi Level Coding and Iterative Multi-Stage Decoding", Texas A&M University, College Station, Texas, USA, 2nd International Symposium on Turbo-Codes & Related Topics, Brest, France, 2000, XP009021988, pp. 165-168.

Narayanaswami, Ravi, "Coded Modulation with Low Density Parity Check Codes", Office of Graduate Studies of Texas A&M University, Jun. 2001, XP-002271230.

Ping, Li et al.; "Low Density Parity Check Codes with Semi-Random Parity Check Matrix"; Electronics Letters; IEEE Stevenage; vol. 35, No. 1; pp. 38-39; Jan. 7, 1999.

Richardson, Thomas J et al, "Efficient Encoding of Low-Density Parity-Check Codes", XP002965294, IEEE Transactions on Information Theory, vol. 476, No. 2, Feb. 2001, pp. 638-656.

Sci-Worx GMBH; "FEC-S2 Next Generation FEC for Digital Video Broadcasting via Satellite"; www.sci-worx.com; 2003.

Selvarathinam, A. et al.; "A Massively Scaleable Decoder Architecture for Low-Density Parity-Check Codes"; Proceedings, IEEE International Symposium on Circuits and Systems; vol. 2; pp. 61-64; May 25-28, 2003.

Sipser, Michael et al.; "Expander Codes"; IEEE 1994; pp. 566-576.

Tullberg et al.; "Bit-Interleaved Coded Modulation for Delay-Constrained Mobile Communications Channels"; Proceedings IEEE Vehicular Technology Conference; VTC 2000; Tokyo, Japan; IEEE, Inc.; New York, U.S.; vol. 3 of 3, Conf. 51, May 15-18, 2000, pp. 2212-2216; XP000968397.

Vasic, Bane; "Structured Iteractively Decodable Codes Based on Steiner Systems and Their Application in Magnetic Recording"; Global Telecommunications Conference; vol. 5; Nov. 2001; pp. 2954-2960.

Vasic, Bane; "Combinatorial Constructions of Low-Density Parity Check Codes for Iterative Decoding"; Proceedings, IEEE International Symposium on Information Theory; 2002; p. 312; Jun. 30-Jul. 5, 2002.

Vasic, Bane; Kirkman Systems and Their Application in Perpendicular Magnetic Recording; IEEE Transactions on Magnetics; vol. 38, No. 4; pp. 1705-1710; Jul. 2002.

Wadayama, Tadashi, "A Coded Modulation Scheme Based on Low Density Parity Check Codes", IEICE Transactions on Fundamentals, U.S., Oct. 2001, vol. E84-A, pp. 2523-2527.

Wesel, Richard D. et al.; "Constellation Labeling for Linear Encoders"; IEEE Transactions on Information Theory; vol. 47, No. 6; Sep. 2001; pp. 2417-2431.

Yeo, Engling et al.; "VLSI Architectures for Iterative Decoders in Magnetic Recording Channels"; IEEE Transactions on Magnetics; vol. 37, Issue 2; Mar. 2001; pp. 748-755.

Zhang, Tong et al, "Joint Code and Decoder Design for Implementation-Oriented (3, k)-regular LDPC Codes", Department of Electrical and Computer Engineering, University of Minnesota, Minneapolis, MN, USA, 2001 IEEE, pp. 1232-1236.

Zhang, Tong et al, High Performance, Low Complexity Decoding of Generalized Low Density Parity Check Codes, IEEE Global Telecommunications Conference, vol. 1, Nov. 25-29, 2001, pp. 181-185.

U.S. Appl. No. 11/059,938, filed Feb. 17, 2005, Mustafa Eroz, Notice of Allowance dated Oct. 17, 2007.

U.S. Appl. No. 10/961,124, filed Oct. 8, 2004, Mustafa Eroz, Non-final Office Action dated Nov. 27, 2007.

Non-final Office Action dated Jun. 11, 2008 in U.S. Appl. No. 10/961,124 filed Oct. 8, 2004 by Mustafa Eroz et al.

* cited by examiner

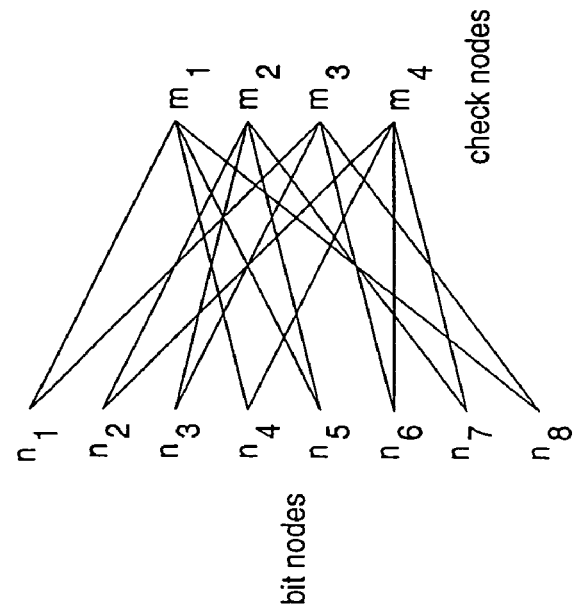

METHOD AND SYSTEM FOR PROVIDING LOW DENSITY PARITY CHECK (LDPC) ENCODING

RELATED APPLICATIONS

This application is a continuation of U.S. patent application Ser. No. 10/613,823 filed Jul. 3, 2003 now U.S. Pat. No. 7,191,378, entitled "Method and System for Providing Low Density Parity Check (LDPC) Encoding", which is related to, and claims the benefit of the earlier filing date under 35 U.S.C. § 119(e) of, U.S. Provisional Patent Application (Ser. No. 60/393,457) filed Jul. 3, 2002, entitled "Code Design and Implementation Improvements for Low Density Parity Check Codes," U.S. Provisional Patent Application (Ser. No. 60/398,760) filed Jul. 26, 2002, entitled "Code Design and Implementation Improvements for Low Density Parity Check Codes," U.S. Provisional Patent Application (Ser. No. 60/403,812) filed Aug. 15, 2002, entitled "Power and Bandwidth Efficient Modulation and Coding Scheme for Direct Broadcast Satellite and Broadcast Satellite Communications," U.S. Provisional Patent Application (Ser. No. 60/421,505), filed Oct. 25, 2002, entitled "Method and System for Generating Low Density Parity Check Codes," U.S. Provisional Patent Application (Ser. No. 60/421,999), filed Oct. 29, 2002, entitled "Satellite Communication System Utilizing Low Density Parity Check Codes," U.S. Provisional Patent Application (Ser. No. 60/423,710), filed Nov. 4, 2002, entitled "Code Design and Implementation Improvements for Low Density Parity Check Codes," U.S. Provisional Patent Application (Ser. No. 60/440,199) filed Jan. 15, 2003, entitled "Novel Solution to Routing Problem in Low Density Parity Check Decoders," U.S. Provisional Patent Application (Ser. No. 60/447,641) filed Feb. 14, 2003, entitled "Low Density Parity Check Code Encoder Design," U.S. Provisional Patent Application (Ser. No. 60/456,220) filed Mar. 20, 2003, entitled "Description LDPC and BCH Encoders," U.S. Provisional Patent Application (Ser. No. 60/469,356) filed May 9, 2003, entitled "Description LDPC and BCH Encoders," U.S. Provisional Patent Application (Ser. No. 60/482,112) filed Jun. 24, 2003, entitled "Description LDPC and BCH Encoders," and U.S. Provisional Patent Application (Ser. No. 60/482,107) filed Jun. 24, 2003, entitled "Description LDPC and BCH Encoders"; the entireties of which are incorporated herein by reference.

FIELD OF THE INVENTION

The present invention relates to communication systems, and more particularly to coded systems.

BACKGROUND OF THE INVENTION

Communication systems employ coding to ensure reliable communication across noisy communication channels. These communication channels exhibit a fixed capacity that can be expressed in terms of bits per symbol at certain signal to noise ratio (SNR), defining a theoretical upper limit (known as the Shannon limit). As a result, coding design has aimed to achieve rates approaching this Shannon limit. One such class of codes that approach the Shannon limit is Low Density Parity Check (LDPC) codes.

Traditionally, LDPC codes have not been widely deployed because of a number of drawbacks. One drawback is that the LDPC encoding technique is highly complex. Encoding an LDPC code using its generator matrix would require storing a very large, non-sparse matrix. Additionally, LDPC codes require large blocks to be effective; consequently, even though parity check matrices of LDPC codes are sparse, storing these matrices is problematic.

From an implementation perspective, a number of challenges are confronted. For example, storage is an important reason why LDPC codes have not become widespread in practice. Also, a key challenge in LDPC code implementation has been how to achieve the connection network between several processing engines (nodes) in the decoder. Further, the computational load in the decoding process, specifically the check node operations, poses a problem.

Therefore, there is a need for an LDPC communication system that employs simple encoding and decoding processes. There is also a need for using LDPC codes efficiently to support high data rates, without introducing greater complexity. There is also a need to improve performance of LDPC encoders and decoders. There is also a need to minimize storage requirements for implementing LDPC coding. There is a further need for a scheme that simplifies the communication between processing nodes in the LDPC decoder.

SUMMARY OF THE INVENTION

These and other needs are addressed by the present invention, wherein an approach for encoding structured Low Density Parity Check (LDPC) codes is provided. Structure of the LDPC codes is provided by restricting portion part of the parity check matrix to be lower triangular and/or satisfying other requirements such that the communication between bit nodes and check nodes of the decoder is simplified. Memory storing information representing the structured parity check matrix is accessed. The information is organized in tabular form, wherein each row represents occurrences of one values within a first column of a group of columns of the parity check matrix. The rows correspond to groups of columns of the parity check matrix, wherein subsequent columns within each of the groups are derived according to a predetermined operation (e.g., cyclic shift, addition, etc.). An LDPC coded signal based on the stored information representing the parity check matrix. According to one embodiment of the present invention, a Bose Chaudhuri Hocquenghem (BCH) encoder is utilized by the transmitter to encode an input signal using BCH codes, wherein the output LDPC coded signal corresponding to the input signal represents a code having an outer BCH code and an inner LDPC code. Further, a cyclic redundancy check (CRC) encoder is supplied to encode the input signal according to a CRC code. The approach advantageously provides expedient encoding as well as decoding of LDPC codes.

According to one aspect of an embodiment of the present invention, a method of encoding is disclosed. The method includes accessing memory storing information representing a structured parity check matrix of Low Density Parity Check (LDPC) codes. The information is organized in tabular form, wherein each row represents occurrences of one values within a first column of a group of columns of the parity check matrix. The rows correspond to groups of columns of the parity check matrix, wherein subsequent columns within each of the groups are derived according to a predetermined operation. The method also includes outputting an LDPC coded signal based on the stored information representing the parity check matrix.

According to another aspect of an embodiment of the present invention, an encoder for generating Low Density Parity Check (LDPC) codes disclosed. The encoder includes memory storing information representing a structured parity check matrix of the LDPC codes. The information is organized in tabular form, wherein each row represents occurrences of one values within a first column of a group of columns of the parity check matrix. The rows correspond to groups of columns of the parity check matrix, wherein subsequent columns within each of the groups are derived according to a predetermined operation. The encoder also includes means for retrieving the stored information representing the parity check matrix to output an LDPC coded signal.

According to another aspect of an embodiment of the present invention, a transmitter utilizing Low Density Parity Check (LDPC) coding disclosed. The transmitter includes memory storing information representing a structured parity check matrix of the LDPC codes, the information being organized in tabular form, wherein each row represents occurrences of one values within a first column of a group of columns of the parity check matrix. The rows correspond to groups of columns of the parity check matrix, wherein subsequent columns within each of the groups are derived according to a predetermined operation. The transmitter also includes an LDPC encoder configured to access the stored information from the memory to output an LDPC coded signal.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4 is a diagram of a sparse parity check matrix, in accordance with an embodiment of the present invention;

FIG. 5 is a diagram of a bipartite graph of an LDPC code of the matrix of FIG. 4;

FIG. 6 is a diagram of a sub-matrix of a sparse parity check matrix, wherein the sub-matrix contains parity check values restricted to the lower triangular region, according to an embodiment of the present invention;

FIGS. 8A and 8B are, respectively, a diagram of a non-Gray 8-PSK modulation scheme, and a Gray 8-PSK modulation, each of which can be used in the system of FIG. 1;

DESCRIPTION OF THE PREFERRED EMBODIMENT

A system, method, and software for efficiently decoding structured Low Density Parity Check (LDPC) codes are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
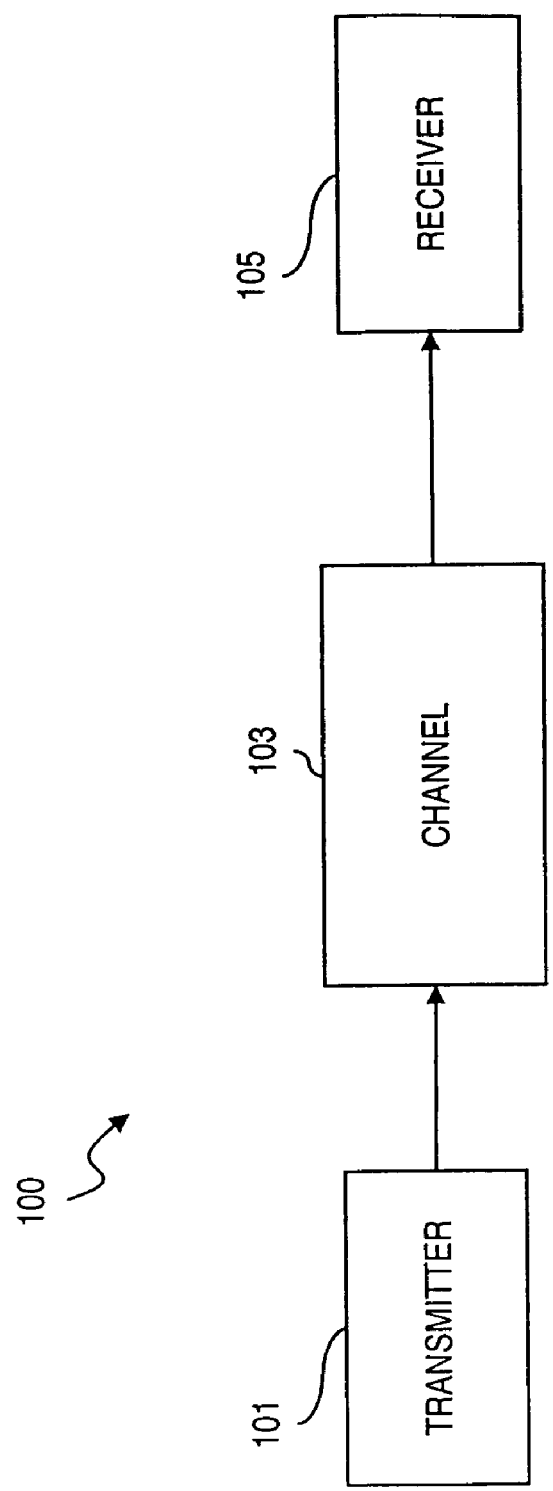
FIG. 1 is a diagram of a communications system configured to utilize Low Density Parity Check (LDPC) codes, according to an embodiment of the present invention.

FIG. 1 is a diagram of a communications system configured to utilize Low Density Parity Check (LDPC) codes, according to an embodiment of the present invention. A digital communications system 100 includes a transmitter 101 that generates signal waveforms across a communication channel 103 to a receiver 105. In this discrete communications system 100, the transmitter 101 has a message source that produces a discrete set of possible messages; each of the possible messages has a corresponding signal waveform. These signal waveforms are attenuated, or otherwise altered, by communications channel 103. To combat the noise channel 103, LDPC codes are utilized.

The LDPC codes that are generated by the transmitter 101 enable high speed implementation without incurring any performance loss. These structured LDPC codes output from the transmitter 101 avoid assignment of a small number of check nodes to the bit nodes already vulnerable to channel errors by virtue of the modulation scheme (e.g., 8-PSK).

Such LDPC codes have a parallelizable decoding algorithm (unlike turbo codes), which advantageously involves simple operations such as addition, comparison and table look-up. Moreover, carefully designed LDPC codes do not exhibit any sign of error floor.

According to one embodiment of the present invention, the transmitter 101 generates, using a relatively simple encoding technique, LDPC codes based on parity check matrices (which facilitate efficient memory access during decoding) to communicate with the receiver 105. The transmitter 101 employs LDPC codes that can outperform concatenated turbo+RS (Reed-Solomon) codes, provided the block length is sufficiently large.

Figure 2A:
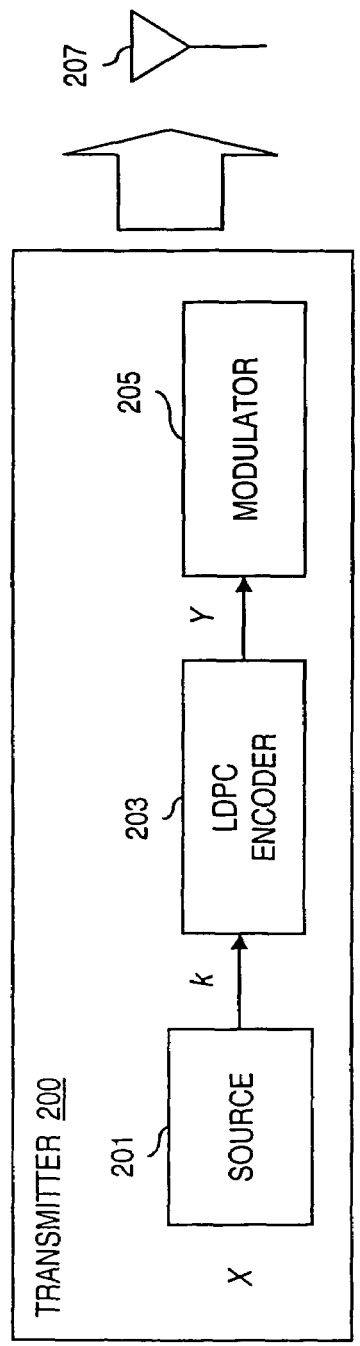
FIGS. 2A and 2B are diagrams of exemplary LDPC encoders deployed in the transmitter of FIG. 1.
Figure 2B:
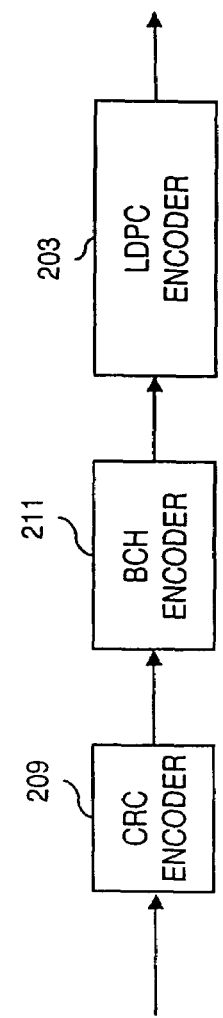

FIGS. 2A and 2B are diagrams of exemplary LDPC encoders deployed in the transmitter of FIG. 1. As seen in FIG. 2A, a transmitter 200 is equipped with an LDPC encoder 203 that accepts input from an information source 201 and outputs coded stream of higher redundancy suitable for error correction processing at the receiver 105. The information source 201 generates k signals from a discrete alphabet, X. LDPC codes are specified with parity check matrices. On the other hand, encoding LDPC codes require, in general, specifying the generator matrices. Even though it is possible to obtain generator matrices from parity check matrices using Gaussian elimination, the resulting matrix is no longer sparse and storing a large generator matrix can be complex.

Encoder 203 generates signals from alphabet Y to a modulator 205 using a simple encoding technique that makes use of only the parity check matrix by imposing structure onto the parity check matrix. Specifically, a restriction is placed on the parity check matrix by constraining certain portion of the matrix to be triangular. The construction of such a parity check matrix is described more fully below in FIG. 6. Such a restriction results in negligible performance loss, and therefore, constitutes an attractive trade-off.

Modulator 205 maps the encoded messages from encoder 203 to signal waveforms that are transmitted to a transmit antenna 207, which emits these waveforms over the communication channel 103. Accordingly, the encoded messages are modulated and distributed to a transmit antenna 207. The transmissions from the transmit antenna 207 propagate to a receiver, as discussed below.

FIG. 2B shows an LDPC encoder utilized with a Bose Chaudhuri Hocquenghem (BCH) encoder and a cyclic redundancy check (CRC) encoder, according to one embodiment of the present invention. Under this scenario, the codes generated by the LDPC encoder 203, along with the CRC encoder 209 and the BCH encoder 211, have a concatenated outer BCH code and inner low density parity check (LDPC) code. Furthermore, error detection is achieved using cyclic redundancy check (CRC) codes. The CRC encoder 209, in an exemplary embodiment, encodes using an 8-bit CRC code with generator polynomial $(x^5+x^4+x^3+x^2+1)(x^2+x+1)(x+1)$.

The LDPC encoder 203 systematically encodes an information block of size $k_{ldpc}$, $i=(i_0, i_1, \ldots, i_{k_{ldpc}-1})$ onto a codeword of size $n_{ldpc}$, $c=(i_0, i_1, \ldots, i_{k_{ldpc}-1}, p_0, p_1, \ldots P_{n_{ldpc}-k_{ldpc}-1})$. The transmission of the codeword starts in the given order from $i_0$ and ends with $p_{n_{ldpc}-k_{ldpc}-1}$. LDPC code parameters ($n_{ldpc}$, $k_{ldpc}$) are given in Table 1 below.

TABLE 1

LDPC Code Parameters ($n_{ldpc}$, $k_{ldpc}$)

| Code Rate | LDPC Uncoded Block Length $k_{ldpc}$ | LDPC Coded Block Length $n_{ldpc}$ |
|---|---|---|
| 1/2 | 32400 | 64800 |
| 2/3 | 43200 | 64800 |
| 3/4 | 48600 | 64800 |
| 4/5 | 51840 | 64800 |
| 5/6 | 54000 | 64800 |
| 3/5 | 38880 | 64800 |
| 8/9 | 57600 | 64800 |
| 9/10 | 58320 | 64800 |

The task of the LDPC encoder 203 is to determine $n_{ldpc} - k_{ldpc}$ parity bits $(p_0, p_1, \ldots, p_{n_{ldpc}-k_{ldpc}-1})$ for every block of $k_{ldpc}$ information bits, $(i_0, i_1, \ldots, i_{k_{ldpc}-1})$. The procedure is as follows. First, the parity bits are initialized;

$p_0=p_1=p_2=\ldots=p_{n_{ldpc}-k_{ldpc}-1}=0$. The first information bit, $i_0$, are accumulated at parity bit addresses specified in the first row of Tables 3 through 10. For example, for rate 2/3 (Table 3), the following results:

$p_0 = p_0 \oplus i_0$ $p_{10491} = p_{10491} \oplus i_0$ $p_{16043} = p_{01643} \oplus i_0$ $p_{506} = p_{506} \oplus i_0$ $p_{12826} = p_{12826} \oplus i_0$ $p_{8065} = p_{8065} \oplus i_0$ $p_{8226} = p_{8226} \oplus i_0$ $p_{2767} = p_{2767} \oplus i_0$ $p_{240} = p_{240} \oplus i_0$ $p_{18673} = p_{18673} \oplus i_0$ $p_{9279} = p_{9279} \oplus i_0$ $p_{10579} = p_{10579} \oplus i_0$ $p_{20928} = p_{20928} \oplus i_0$ (All additions are in GF(2)).

Then, for the next 359 information bits, $i_m$, m=1, 2, ..., 359, these bits are accumulated at parity bit addresses {x+m mod 360×q} mod($n_{ldpc}-k_{ldpc}$), where x denotes the address of the parity bit accumulator corresponding to the first bit $i_0$, and q is a code rate dependent constant specified in Table 2. Continuing with the example, q=60 for rate 2/3. By way of example, for information bit $i_1$, the following operations are performed:

$p_{60} = p_{60} \oplus i_1$ $p_{10551} = p_{10551} \oplus i_1$ $p_{16103} = p_{106103} \oplus i_1$ $p_{566} = p_{566} \oplus i_1$ $p_{12886} = p_{12886} \oplus i_1$ $p_{8125} = p_{8125} \oplus i_1$ $p_{8286} = p_{8286} \oplus i_1$ $p_{2827} = p_{2827} \oplus i_1$ $p_{300} = p_{300} \oplus i_1$ $p_{18733} = p_{18733} \oplus i_1$ $p_{9339} = p_{9339} \oplus i_1$ $p_{10639} = p_{10639} \oplus i_1$ $p_{20988} = p_{20988} \oplus i_1$ For the 361$^{st}$ information bit $i_{360}$, the addresses of the parity bit accumulators are given in the second row of the Tables 3 through 10. In a similar manner the addresses of the parity bit accumulators for the following 359 information bits $i_m$, m=361,362, ..., 719 are obtained using the formula {x+m mod 360×q} mod($n_{ldpc}-k_{ldpc}$), where x denotes the address of the parity bit accumulator corresponding to the information bit $i_{360}$, i.e., the entries in the second row of the Tables 3-10. In a similar manner, for every group of 360 new information bits, a new row from Tables 3 through 10 are used to find the addresses of the parity bit accumulators.

After all of the information bits are exhausted, the final parity bits are obtained as follows. First, the following operations are performed, starting with i=1

$$p_i = p_i \oplus p_{i-1}, i=1, 2, \ldots, n_{ldpc}-k_{ldpc}-1.$$

Final content of $p_i$, i=0, 1, ..., $n_{ldpc}-k_{ldpc}-1$ is equal to the parity bit $p_i$.

TABLE 2

| Code Rate | q |
|---|---|
| 2/3 | 60 |
| 5/6 | 30 |
| 1/2 | 90 |
| 3/4 | 45 |
| 4/5 | 36 |
| 3/5 | 72 |
| 8/9 | 20 |
| 9/10 | 18 |

TABLE 3

Address of Parity Bit Accumulators (Rate 2/3)

0 10491 16043 506 12826 8065 8226 2767 240 18673 9279 10579 20928
1 17819 8313 6433 6224 5120 5824 12812 17187 9940 13447 13825 18483
2 17957 6024 8681 18628 12794 5915 14576 10970 12064 20437 4455 7151
3 19777 6183 9972 14536 8182 17749 11341 5556 4379 17434 15477 18532
4 4651 19689 1608 659 16707 14335 6143 3058 14618 17894 20684 5306
5 9778 2552 12096 12369 15198 16890 4851 3109 1700 18725 1997 15882
6 486 6111 13743 11537 5591 7433 15227 14145 1483 3887 17431 12430
7 20647 14311 11734 4180 8110 5525 12141 15761 18661 18441 10569 8192
8 3791 14759 15264 19918 10132 9062 10010 12786 10675 9682 19246 5454
9 19525 9485 7777 19999 8378 9209 3163 20232 6690 16518 716 7353
10 4588 6709 20202 10905 915 4317 11073 13576 16433 368 3508 21171
11 14072 4033 19959 12608 631 19494 14160 8249 10223 21504 12395 4322
12 13800 14161
13 2948 9647
14 14693 16027
15 20506 11082
16 1143 9020
17 13501 4014
18 1548 2190
19 12216 21556
20 2095 19897
21 4189 7958
22 15940 10048
23 515 12614
24 8501 8450
25 17595 16784
26 5913 8495
27 16394 10423
28 7409 6981
29 6678 15939
30 20344 12987
31 2510 14588
32 17918 6655
33 6703 19451
34 496 4217
35 7290 5766
36 10521 8925
37 20379 11905
38 4090 5838

TABLE 3-continued

Address of Parity Bit Accumulators (Rate 2/3)

39 19082 17040
40 20233 12352
41 19365 19546
42 6249 19030
43 11037 19193
44 19760 11772
45 19644 7428
46 16076 3521
47 11779 21062
48 13062 9682
49 8934 5217
50 11087 3319
51 18892 4356
52 7894 3898
53 5963 4360
54 7346 11726
55 5182 5609
56 2412 17295
57 9845 20494
58 6687 1864
59 20564 5216
0 18226 17207
1 9380 8266
2 7073 3065
3 18252 13437
4 9161 15642
5 10714 10153
6 11585 9078
7 5359 9418
8 9024 9515
9 1206 16354
10 14994 1102
11 9375 20796
12 15964 6027
13 14789 6452
14 8002 18591
15 14742 14089
16 253 3045
17 1274 19286
18 14777 2044
19 13920 9900
20 452 7374
21 18206 9921
22 6131 5414
23 10077 9726
24 12045 5479
25 4322 7990
26 15616 5550
27 15561 10661
28 20718 7387
29 2518 18804
30 8984 2600
31 6516 17909
32 11148 98
33 20559 3704
34 7510 1569
35 16000 11692
36 9147 10303
37 16650 191
38 15577 18685
39 17167 20917
40 4256 3391
41 20092 17219
42 9218 5056
43 18429 8472
44 12093 20753
45 16345 12748
46 16023 11095
47 5048 17595
48 18995 4817
49 16483 3536
50 1439 16148
51 3661 3039
52 19010 18121
53 8968 11793
54 13427 18003
55 5303 3083

TABLE 3-continued

Address of Parity Bit Accumulators (Rate ⅔)

56 531 16668
57 4771 6722
58 5695 7960
59 3589 14630

TABLE 4

Address of Parity Bit Accumulators (Rate ⅚)

0 4362 416 8909 4156 3216 3112 2560 2912 6405 8593 4969 6723
1 2479 1786 8978 3011 4339 9313 6397 2957 7288 5484 6031 10217
2 10175 9009 9889 3091 4985 7267 4092 8874 5671 2777 2189 8716
3 9052 4795 3924 4370 10058 1128 9996 10165 9360 4297 434 5138
4 2379 7834 4835 2327 9843 804 329 8353 7167 3070 1528 7311
5 3435 7871 348 3693 1876 6585 10340 7144 5870 2084 4052 2780
6 3917 3111 3476 1304 10331 5939 5199 1611 1991 699 8316 9960
7 6883 3237 1717 10752 7891 9764 4745 3888 10009 4176 4614 1567
8 10587 2195 1689 2968 5420 2580 2883 6496 111 6023 1024 4449
9 3786 8593 2074 3321 5057 1450 3840 5444 6572 3094 9892 1512
10 8548 1848 10372 4585 7313 6536 6379 1766 9462 2456 5606 9975
11 8204 10593 7935 3636 3882 394 5968 8561 2395 7289 9267 9978
12 7795 74 1633 9542 6867 7352 6417 7568 10623 725 2531 9115
13 7151 2482 4260 5003 10105 7419 9203 6691 8798 2092 8263 3755
14 3600 570 4527 200 9718 6771 1995 8902 5446 768 1103 6520
15 6304 7621
16 6498 9209
17 7293 6786
18 5950 1708
19 8521 1793
20 6174 7854
21 9773 1190
22 9517 10268
23 2181 9349
24 1949 5560
25 1556 555
26 8600 3827
27 5072 1057
28 7928 3542
29 3226 3762
0 7045 2420
1 9645 2641
2 2774 2452
3 5331 2031
4 9400 7503
5 1850 2338
6 10456 9774
7 1692 9276
8 10037 4038
9 3964 338
10 2640 5087
11 858 3473
12 5582 5683
13 9523 916
14 4107 1559
15 4506 3491
16 8191 4182
17 10192 6157
18 5668 3305
19 3449 1540
20 4766 2697
21 4069 6675
22 1117 1016
23 5619 3085
24 8483 8400
25 8255 394
26 6338 5042
27 6174 5119
28 7203 1989
29 1781 5174
0 1464 3559
1 3376 4214
2 7238 67
3 10595 8831
4 1221 6513

TABLE 4-continued

Address of Parity Bit Accumulators (Rate ⅚)

5 5300 4652
6 1429 9749
7 7878 5131
8 4435 10284
9 6331 5507
10 6662 4941
11 9614 10238
12 8400 8025
13 9156 5630
14 7067 8878
15 9027 3415
16 1690 3866
17 2854 8469
18 6206 630
19 363 5453
20 4125 7008
21 1612 6702
22 9069 9226
23 5767 4060
24 3743 9237
25 7018 5572
26 8892 4536
27 853 6064
28 8069 5893
29 2051 2885
0 10691 3153
1 3602 4055
2 328 1717
3 2219 9299
4 1939 7898
5 617 206
6 8544 1374
7 10676 3240
8 6672 9489
9 3170 7457
10 7868 5731
11 6121 10732
12 4843 9132
13 580 9591
14 6267 9290
15 3009 2268
16 195 2419
17 8016 1557
18 1516 9195
19 8062 9064
20 2095 8968
21 753 7326
22 6291 3833
23 2614 7844
24 2303 646
25 2075 611
26 4687 362
27 8684 9940
28 4830 2065
29 7038 1363
0 1769 7837
1 3801 1689
2 10070 2359
3 3667 9918
4 1914 6920
5 4244 5669
6 10245 7821
7 7648 3944
8 3310 5488
9 6346 9666
10 7088 6122
11 1291 7827
12 10592 8945
13 3609 7120
14 9168 9112
15 6203 8052
16 3330 2895
17 4264 10563
18 10556 6496
19 8807 7645
20 1999 4530
21 9202 6818

TABLE 4-continued

Address of Parity Bit Accumulators (Rate 5/6)

22 3403 1734
23 2106 9023
24 6881 3883
25 3895 2171
26 4062 6424
27 3755 9536
28 4683 2131
29 7347 8027

TABLE 5

Address of Parity Bit Accumulators (Rate 1/2)

54 9318 14392 27561 26909 10219 2534 8597
55 7263 4635 2530 28130 3033 23830 3651
56 24731 23583 26036 17299 5750 792 9169
57 5811 26154 18653 11551 15447 13685 16264
58 12610 11347 28768 2792 3174 29371 12997
59 16789 16018 21449 6165 21202 15850 3186
60 31016 21449 17618 6213 12166 8334 18212
61 22836 14213 11327 5896 718 11727 9308
62 2091 24941 29966 23634 9013 15587 5444
63 22207 3983 16904 28534 21415 27524 25912
64 25687 4501 22193 14665 14798 16158 5491
65 4520 17094 23397 4264 22370 16941 21526
66 10490 6182 32370 9597 30841 25954 2762
67 22120 22865 29870 15147 13668 14955 19235
68 6689 18408 18346 9918 25746 5443 20645
69 29982 12529 13858 4746 30370 10023 24828
70 1262 28032 29888 13063 24033 21951 7863
71 6594 29642 31451 14831 9509 9335 31552
72 1358 6454 16633 20354 24598 624 5265
73 19529 295 18011 3080 13364 8032 15323
74 11981 1510 7960 21462 9129 11370 25741
75 9276 29656 4543 30699 20646 21921 28050
76 15975 25634 5520 31119 13715 21949 19605
77 18688 4608 31755 30165 13103 10706 29224
78 21514 23117 12245 26035 31656 25631 30699
79 9674 24966 31285 29908 17042 24588 31857
80 21856 27777 29919 27000 14897 11409 7122
81 29773 23310 263 4877 28622 20545 22092
82 15605 5651 21864 3967 14419 22757 15896
83 30145 1759 10139 29223 26086 10556 5098
84 18815 16575 2936 24457 26738 6030 505
85 30326 22298 27562 20131 26390 6247 24791
86 928 29246 21246 12400 15311 32309 18608
87 20314 6025 26689 16302 2296 3244 19613
88 6237 11943 22851 15642 23857 15112 20947
89 26403 25168 19038 18384 8882 12719 7093
 0 14567 24965
 1 3908 100
 2 10279 240
 3 24102 764
 4 12383 4173
 5 13861 15918
 6 21327 1046
 7 5288 14579
 8 28158 8069
 9 16583 11098
10 16681 28363
11 13980 24725
12 32169 17989
13 10907 2767
14 21557 3818
15 26676 12422
16 7676 8754
17 14905 20232
18 15719 24646
19 31942 8589
20 19978 27197
21 27060 15071
22 6071 26649
23 10393 11176
24 9597 13370

TABLE 5-continued

Address of Parity Bit Accumulators (Rate 1/2)

25 7081 17677
26 1433 19513
27 26925 9014
28 19202 8900
29 18152 30647
30 20803 1737
31 11804 25221
32 31683 17783
33 29694 9345
34 12280 26611
35 6526 26122
36 26165 11241
37 7666 26962
38 16290 8480
39 11774 10120
40 30051 30426
41 1335 15424
42 6865 17742
43 31779 12489
44 32120 21001
45 14508 6996
46 979 25024
47 4554 21896
48 7989 21777
49 4972 20661
50 6612 2730
51 12742 4418
52 29194 595
53 19267 20113

TABLE 6

Address of Parity Bit Accumulators (Rate 3/4)

0 6385 7901 14611 13389 11200 3252 5243 2504 2722 821 7374
 1 11359 2698 357 13824 12772 7244 6752 15310 852 2001 11417
 2 7862 7977 6321 13612 12197 14449 15137 13860 1708 6399 13444
 3 1560 11804 6975 13292 3646 3812 8772 7306 5795 14327 7866
 4 7626 11407 14599 9689 1628 2113 10809 9283 1230 15241 4870
 5 1610 5699 15876 9446 12515 1400 6303 5411 14181 13925 7358
 6 4059 8836 3405 7853 7992 15336 5970 10368 10278 9675 4651
 7 4441 3963 9153 2109 12683 7459 12030 12221 629 15212 406
 8 6007 8411 5771 3497 543 14202 875 9186 6235 13908 3563
 9 3232 6625 4795 546 9781 2071 7312 3399 7250 4932 12652
10 8820 10088 11090 7069 6585 13134 10158 7183 488 7455 9238
11 1903 10818 119 215 7558 11046 10615 11545 14784 7961 15619
12 3655 8736 4917 15874 5129 2134 15944 14768 7150 2692 1469
13 8316 3820 505 8923 6757 806 7957 4216 15589 13244 2622
14 14463 4852 15733 3041 11193 12860 13673 8152 6551 15108 8758
15 3149 11981
16 13416 6906
17 13098 13352
18 2009 14460
19 7207 4314
20 3312 3945
21 4418 6248
22 2669 13975
23 7571 9023
24 14172 2967
25 7271 7138
26 6135 13670
27 7490 14559
28 8657 2466
29 8599 12834
30 3470 3152
31 13917 4365
32 6024 13730
33 10973 14182
34 2464 13167
35 5281 15049
36 1103 1849
37 2058 1069
38 9654 6095
39 14311 7667

TABLE 6-continued

Address of Parity Bit Accumulators (Rate ¾)

40 15617 8146
41 4588 11218
42 13660 6243
43 8578 7874
44 11741 2686
0 1022 1264
1 12604 9965
2 8217 2707
3 3156 11793
4 354 1514
5 6978 14058
6 7922 16079
7 15087 12138
8 5053 6470
9 12687 14932
10 15458 1763
11 8121 1721
12 12431 549
13 4129 7091
14 1426 8415
15 9783 7604
16 6295 11329
17 1409 12061
18 8065 9087
19 2918 8438
20 1293 14115
21 3922 13851
22 3851 4000
23 5865 1768
24 2655 14957
25 5565 6332
26 4303 12631
27 11653 12236
28 16025 7632
29 4655 14128
30 9584 13123
31 13987 9597
32 15409 12110
33 8754 15490
34 7416 15325
35 2909 15549
36 2995 8257
37 9406 4791
38 11111 4854
39 2812 8521
40 8476 14717
41 7820 15360
42 1179 7939
43 2357 8678
44 7703 6216
0 3477 7067
1 3931 13845
2 7675 12899
3 1754 8187
4 7785 1400
5 9213 5891
6 2494 7703
7 2576 7902
8 4821 15682
9 10426 11935
10 1810 904
11 11332 9264
12 11312 3570
13 14916 2650
14 7679 7842
15 6089 13084
16 3938 2751
17 8509 4648
18 12204 8917
19 5749 12443
20 12613 4431
21 1344 4014
22 8488 13850
23 1730 14896
24 14942 7126
25 14983 8863
26 6578 8564

TABLE 6-continued

Address of Parity Bit Accumulators (Rate ¾)

27 4947 396
28 297 12805
29 13878 6692
30 11857 11186
31 14395 11493
32 16145 12251
33 13462 7428
34 14526 13119
35 2535 11243
36 6465 12690
37 6872 9334
38 15371 14023
39 8101 10187
40 11963 4848
41 15125 6119
42 8051 14465
43 11139 5167
44 2883 14521

TABLE 7

Address of Parity Bit Accumulators (Rate ⅘)

0 149 11212 5575 6360 12559 8108 8505 408 10026 12828
1 5237 490 10677 4998 3869 3734 3092 3509 7703 10305
2 8742 5553 2820 7085 12116 10485 564 7795 2972 2157
3 2699 4304 8350 712 2841 3250 4731 10105 517 7516
4 12067 1351 11992 12191 11267 5161 537 6166 4246 2363
5 6828 7107 2127 3724 5743 11040 10756 4073 1011 3422
6 11259 1216 9526 1466 10816 940 3744 2815 11506 11573
7 4549 11507 1118 1274 11751 5207 7854 12803 4047 6484
8 8430 4115 9440 413 4455 2262 7915 12402 8579 7052
9 3885 9126 5665 4505 2343 253 4707 3742 4166 1556
10 1704 8936 6775 8639 8179 7954 8234 7850 8883 8713
11 11716 4344 9087 11264 2274 8832 9147 11930 6054 5455
12 7323 3970 10329 2170 8262 3854 2087 12899 9497 11700
13 4418 1467 2490 5841 817 11453 533 11217 11962 5251
14 1541 4525 7976 3457 9536 7725 3788 2982 6307 5997
15 11484 2739 4023 12107 6516 551 2572 6628 8150 9852
16 6070 1761 4627 6534 7913 3730 11866 1813 12306 8249
17 12441 5489 8748 7837 7660 2102 11341 2936 6712 11977
18 10155 4210
19 1010 10483
20 8900 10250
21 10243 12278
22 7070 4397
23 12271 3887
24 11980 6836
25 9514 4356
26 7137 10281
27 11881 2526
28 1969 11477
29 3044 10921
30 2236 8724
31 9104 6340
32 7342 8582
33 11675 10405
34 6467 12775
35 3186 12198
0 9621 11445
1 7486 5611
2 4319 4879
3 2196 344
4 7527 6650
5 10693 2440
6 6755 2706
7 5144 5998
8 11043 8033
9 4846 4435
10 4157 9228
11 12270 6562
12 11954 7592
13 7420 2592
14 8810 9636

TABLE 7-continued

Address of Parity Bit Accumulators (Rate 4/5)

15 689 5430
16 920 1304
17 1253 11934
18 9559 6016
19 312 7589
20 4439 4197
21 4002 9555
22 12232 7779
23 1494 8782
24 10749 3969
25 4368 3479
26 6316 5342
27 2455 3493
28 12157 7405
29 6598 11495
30 11805 4455
31 9625 2090
32 4731 2321
33 3578 2608
34 8504 1849
35 4027 1151
0 5647 4935
1 4219 1870
2 10968 8054
3 6970 5447
4 3217 5638
5 8972 669
6 5618 12472
7 1457 1280
8 8868 3883
9 8866 1224
10 8371 5972
11 266 4405
12 3706 3244
13 6039 5844
14 7200 3283
15 1502 11282
16 12318 2202
17 4523 965
18 9587 7011
19 2552 2051
20 12045 10306
21 11070 5104
22 6627 6906
23 9889 2121
24 829 9701
25 2201 1819
26 6689 12925
27 2139 8757
28 12004 5948
29 8704 3191
30 8171 10933
31 6297 7116
32 616 7146
33 5142 9761
34 10377 8138
35 7616 5811
0 7285 9863
1 7764 10867
2 12343 9019
3 4414 8331
4 3464 642
5 6960 2039
6 786 3021
7 710 2086
8 7423 5601
9 8120 4885
10 12385 11990
11 9739 10034
12 424 10162
13 1347 7597
14 1450 112
15 7965 8478
16 8945 7397
17 6590 8316
18 6838 9011
19 6174 9410

TABLE 7-continued

Address of Parity Bit Accumulators (Rate 4/5)

20 255 113
21 6197 5835
22 12902 3844
23 4377 3505
24 5478 8672
25 4453 2132
26 9724 1380
27 12131 11526
28 12323 9511
29 8231 1752
30 497 9022
31 9288 3080
32 2481 7515
33 2696 268
34 4023 12341
35 7108 5553

TABLE 8

Address of Parity Bit Accumulators (Rate 3/5)

22422 10282 11626 19997 11161 2922 3122 99 5625 17064 8270 179
25087 16218 17015 828 20041 25656 4186 11629 22599 17305 22515
6463 11049 22853 25706 14388 5500 19245 8732 2177 13555 11346
17265 3069 16581 22225 12563 19717 23577 11555 25496 6853 25403
5218 15925 21766 16529 14487 7643 10715 17442 11119 5679 14155
24213 21000 1116 15620 5340 8636 16693 1434 5635 6516 9482 20189
1066 15013 25361 14243 18506 22236 20912 8952 5421 15691 6126
21595 500 6904 13059 6802 8433 4694 5524 14216 3685 19721 25420
9937 23813 9047 25651 16826 21500 24814 6344 17382 7064 13929
4004 16552 12818 8720 5286 2206 22517 2429 19065 2921 21611 1873
7507 5661 23006 23128 20543 19777 1770 4636 20900 14931 9247
12340 11008 12966 4471 2731 16445 791 6635 14556 18865 22421
22124 12697 9803 25485 7744 18254 11313 9004 19982 23963 18912
7206 12500 4382 20067 6177 21007 1195 23547 24837 756 11158 14646
20534 3647 17728 11676 11843 12937 4402 8261 22944 9306 24009
10012 11081 3746 24325 8060 19826 842 8836 2898 5019 7575 7455
25244 4736 14400 22981 5543 8006 24203 13053 1120 5128 3482 9270
13059 15825 7453 23747 3656 24585 16542 17507 22462 14670 15627
15290 4198 22748 5842 13395 23918 16985 14929 3726 25350 24157
24896 16365 16423 13461 16615 8107 24741 3604 25904 8716 9604
20365 3729 17245 18448 9862 20831 25326 20517 24618 13282 5099
14183 8804 16455 17646 15376 18194 25528 1777 6066 21855 14372
12517 4488 17490 1400 8135 23375 20879 8476 4084 12936 25536
22309 16582 6402 24360 25119 23586 128 4761 10443 22536 8607 9752
25446 15053 1856 4040 377 21160 13474 5451 17170 5938 10256 11972
24210 17833 22047 16108 13075 9648 24546 13150 23867 7309 19798
2988 16858 4825 23950 15125 20526 3553 11525 23366 2452 17626
19265 20172 18060 24593 13255 1552 18839 21132 20119 15214 14705
7096 10174 5663 18651 19700 12524 14033 4127 2971 17499 16287
22368 21463 7943 18880 5567 8047 23363 6797 10651 24471 14325
4081 7258 4949 7044 1078 797 22910 20474 4318 21374 13231 22985
5056 3821 23718 14178 9978 19030 23594 8895 25358 6199 22056 7749
13310 3999 23697 16445 22636 5225 22437 24153 9442 7978 12177
2893 20778 3175 8645 11863 24623 10311 25767 17057 3691 20473
11294 9914 22815 2574 8439 3699 5431 24840 21908 16088 18244 8208
5755 19059 8541 24924 6454 11234 10492 16406 10831 11436 9649
16264 11275 24953 2347 12667 19190 7257 7174 24819 2938 2522
11749 3627 5969 13862 1538 23176 6353 2855 17720 2472 7428 573
15036
0 18539 18661
1 10502 3002
2 9368 10761
3 12299 7828
4 15048 13362
5 18444 24640
6 20775 19175
7 18970 10971
8 5329 19982
9 11296 18655
10 15046 20659
11 7300 22140
12 22029 14477
13 11129 742

TABLE 8-continued

Address of Parity Bit Accumulators (Rate ⅔)

14 13254 13813
15 19234 13273
16 6079 21122
17 22782 5828
18 19775 4247
19 1660 19413
20 4403 3649
21 13371 25851
22 22770 21784
23 10757 14131
24 16071 21617
25 6393 3725
26 597 19968
27 5743 8084
28 6770 9548
29 4285 17542
30 13568 22599
31 1786 4617
32 23238 11648
33 19627 2030
34 13601 13458
35 13740 17328
36 25012 13944
37 22513 6687
38 4934 12587
39 21197 5133
40 22705 6938
41 7534 24633
42 24400 12797
43 21911 25712
44 12039 1140
45 24306 1021
46 14012 20747
47 11265 15219
48 4670 15531
49 9417 14359
50 2415 6504
51 24964 24690
52 14443 8816
53 6926 1291
54 6209 20806
55 13915 4079
56 24410 13196
57 13505 6117
58 9869 8220
59 1570 6044
60 25780 17387
61 20671 24913
62 24558 20591
63 12402 3702
64 8314 1357
65 20071 14616
66 17014 3688
67 19837 946
68 15195 12136
69 7758 22808
70 3564 2925
71 3434 7769

TABLE 9

Address of Parity Bit Accumulators (Rate ⅚)

0 6235 2848 3222
1 5800 3492 5348
2 2757 927 90
3 6961 4516 4739
4 1172 3237 6264
5 1927 2425 3683
6 3714 6309 2495
7 3070 6342 7154
8 2428 613 3761
9 2906 264 5927
10 1716 1950 4273

TABLE 9-continued

Address of Parity Bit Accumulators (Rate ⅚)

11 4613 6179 3491
12 4865 3286 6005
13 1343 5923 3529
14 4589 4035 2132
15 1579 3920 6737
16 1644 1191 5998
17 1482 2381 4620
18 6791 6014 6596
19 2738 5918 3786
0 5156 6166
1 1504 4356
2 130 1904
3 6027 3187
4 6718 759
5 6240 2870
6 2343 1311
7 1039 5465
8 6617 2513
9 1588 5222
10 6561 535
11 4765 2054
12 5966 6892
13 1969 3869
14 3571 2420
15 4632 981
16 3215 4163
17 973 3117
18 3802 6198
19 3794 3948
0 3196 6126
1 573 1909
2 850 4034
3 5622 1601
4 6005 524
5 5251 5783
6 172 2032
7 1875 2475
8 497 1291
9 2566 3430
10 1249 740
11 2944 1948
12 6528 2899
13 2243 3616
14 867 3733
15 1374 4702
16 4698 2285
17 4760 3917
18 1859 4058
19 6141 3527
0 2148 5066
1 1306 145
2 2319 871
3 3463 1061
4 5554 6647
5 5837 339
6 5821 4932
7 6356 4756
8 3930 418
9 211 3094
10 1007 4928
11 3584 1235
12 6982 2869
13 1612 1013
14 953 4964
15 4555 4410
16 4925 4842
17 5778 600
18 6509 2417
19 1260 4903
0 3369 3031
1 3557 3224
2 3028 583
3 3258 440
4 6226 6655
5 4895 1094
6 1481 6847
7 4433 1932

TABLE 9-continued

Address of Parity Bit Accumulators (Rate 8/9)

8 2107 1649
9 2119 2065
10 4003 6388
11 6720 3622
12 3694 4521
13 1164 7050
14 1965 3613
15 4331 66
16 2970 1796
17 4652 3218
18 1762 4777
19 5736 1399
0 970 2572
1 2062 6599
2 4597 4870
3 1228 6913
4 4159 1037
5 2916 2362
6 395 1226
7 6911 4548
8 4618 2241
9 4120 4280
10 5825 474
11 2154 5558
12 3793 5471
13 5707 1595
14 1403 325
15 6601 5183
16 6369 4569
17 4846 896
18 7092 6184
19 6764 7127
0 6358 1951
1 3117 6960
2 2710 7062
3 1133 3604
4 3694 657
5 1355 110
6 3329 6736
7 2505 3407
8 2462 4806
9 4216 214
10 5348 5619
11 6627 6243
12 2644 5073
13 4212 5088
14 3463 3889
15 5306 478
16 4320 6121
17 3961 1125
18 5699 1195
19 6511 792
0 3934 2778
1 3238 6587
2 1111 6596
3 1457 6226
4 1446 3885
5 3907 4043
6 6839 2873
7 1733 5615
8 5202 4269
9 3024 4722
10 5445 6372
11 370 1828
12 4695 1600
13 680 2074
14 1801 6690
15 2669 1377
16 2463 1681
17 5972 5171
18 5728 4284
19 1696 1459

TABLE 10

Address of Parity Bit Accumulators (Rate 9/10)

0 5611 2563 2900
1 5220 3143 4813
2 2481 834 81
3 6265 4064 4265
4 1055 2914 5638
5 1734 2182 3315
6 3342 5678 2246
7 2185 552 3385
8 2615 236 5334
9 1546 1755 3846
10 4154 5561 3142
11 4382 2957 5400
12 1209 5329 3179
13 1421 3528 6063
14 1480 1072 5398
15 3843 1777 4369
16 1334 2145 4163
17 2368 5055 260
0 6118 5405
1 2994 4370
2 3405 1669
3 4640 5550
4 1354 3921
5 117 1713
6 5425 2866
7 6047 683
8 5616 2582
9 2108 1179
10 933 4921
11 5953 2261
12 1430 4699
13 5905 480
14 4289 1846
15 5374 6208
16 1775 3476
17 3216 2178
0 4165 884
1 2896 3744
2 874 2801
3 3423 5579
4 3404 3552
5 2876 5515
6 516 1719
7 765 3631
8 5059 1441
9 5629 598
10 5405 473
11 4724 5210
12 155 1832
13 1689 2229
14 449 1164
15 2308 3088
16 1122 669
17 2268 5758
0 5878 2609
1 782 3359
2 1231 4231
3 4225 2052
4 4286 3517
5 5531 3184
6 1935 4560
7 1174 131
8 3115 956
9 3129 1088
10 5238 4440
11 5722 4280
12 3540 375
13 191 2782
14 906 4432
15 3225 1111
16 6296 2583
17 1457 903
0 855 4475
1 4097 3970
2 4433 4361
3 5198 541
4 1146 4426

TABLE 10-continued

Address of Parity Bit Accumulators (Rate 9/10)

5 3202 2902
6 2724 525
7 1083 4124
8 2326 6003
9 5605 5990
10 4376 1579
11 4407 984
12 1332 6163
13 5359 3975
14 1907 1854
15 3601 5748
16 6056 3266
17 3322 4085
0 1768 3244
1 2149 144
2 1589 4291
3 5154 1252
4 1855 5939
5 4820 2706
6 1475 3360
7 4266 693
8 4156 2018
9 2103 752
10 3710 3853
11 5123 931
12 6146 3323
13 1939 5002
14 5140 1437
15 1263 293
16 5949 4665
17 4548 6380
0 3171 4690
1 5204 2114
2 6384 5565
3 5722 1757
4 2805 6264
5 1202 2616
6 1018 3244
7 4018 5289
8 2257 3067
9 2483 3073
10 1196 5329
11 649 3918
12 3791 4581
13 5028 3803
14 3119 3506
15 4779 431
16 3888 5510
17 4387 4084
0 5836 1692
1 5126 1078
2 5721 6165
3 3540 2499
4 2225 6348
5 1044 1484
6 6323 4042
7 1313 5603
8 1303 3496
9 3516 3639
10 5161 2293
11 4682 3845
12 3045 643
13 2818 2616
14 3267 649
15 6236 593
16 646 2948
17 4213 1442
0 5779 1596
1 2403 1237
2 2217 1514
3 5609 716
4 5155 3858
5 1517 1312
6 2554 3158
7 5280 2643
8 4990 1353
9 5648 1170

TABLE 10-continued

Address of Parity Bit Accumulators (Rate 9/10)

10 1152 4366
11 3561 5368
12 3581 1411
13 5647 4661
14 1542 5401
15 5078 2687
16 316 1755
17 3392 1991

As regards the BCH encoder 211, the BCH code parameters are enumerated in Table 11.

TABLE 11

| LDPC Code Rate | BCH Uncoded Block Length $k_{bch}$ | BCH Coded Block Length $n_{bch}$ | BCH Error Correction (bits) |
|---|---|---|---|
| 1/2 | 32208 | 32400 | 12 |
| 2/3 | 43040 | 43200 | 10 |
| 3/4 | 48408 | 48600 | 12 |
| 4/5 | 51648 | 51840 | 12 |
| 5/6 | 53840 | 54000 | 10 |
| 3/5 | 38688 | 38880 | 12 |
| 8/9 | 57472 | 57600 | 8 |
| 9/10 | 58192 | 58320 | 8 |

It is noted that in the above table, $n_{bch}=k_{ldpc}$.

The generator polynomial of the t error correcting BCH encoder 211 is obtained by multiplying the first t polynomials in the following list of Table 12:

TABLE 12

$g_1(x)$  $1 + x^2 + x^3 + x^5 + x^{16}$
$g_2(x)$  $1 + x + x^4 + x^5 + x^6 + x^8 + x^{16}$
$g_3(x)$  $1 + x^2 + x^3 + x^4 + x^5 + x^7 + x^8 + x^9 + x^{10} + x^{11} + x^{16}$
$g_4(x)$  $1 + x^2 + x^4 + x^6 + x^9 + x^{11} + x^{12} + x^{14} + x^{16}$
$g_5(x)$  $1 + x + x^2 + x^3 + x^5 + x^8 + x^9 + x^{10} + x^{11} + x^{12} + x^{16}$
$g_6(x)$  $1 + x^2 + x^4 + x^5 + x^7 + x^8 + x^9 + x^{10} + x^{12} + x^{13} + x^{14} + x^{15} + x^{16}$
$g_7(x)$  $1 + x^2 + x^5 + x^6 + x^8 + x^9 + x^{10} + x^{11} + x^{13} + x^{15} + x^{16}$
$g_8(x)$  $1 + x + x^2 + x^5 + x^6 + x^8 + x^9 + x^{12} + x^{13} + x^{14} + x^{16}$
$g_9(x)$  $1 + x^5 + x^7 + x^9 + x^{10} + x^{11} + x^{16}$
$g_{10}(x)$  $1 + x + x^2 + x^5 + x^7 + x^8 + x^{10} + x^{12} + x^{13} + x^{14} + x^{16}$
$g_{11}(x)$  $1 + x^2 + x^3 + x^5 + x^9 + x^{11} + x^{12} + x^{13} + x^{16}$
$g_{12}(x)$  $1 + x + x^5 + x^6 + x^7 + x^9 + x^{11} + x^{12} + x^{16}$

BCH encoding of information bits $m=(m_{k_{bch}-1}, m_{k_{bch}-2}, \ldots, m_1, m_0)$ onto a codeword $c=(m_{k_{bch}-1}, m_{k_{bch}-2}, \ldots, m_1, m_0, d_{n_{bch}-k_{bch}-1}, d_{n_{bch}-k_{bch}-2}, \ldots, d_1, d_0)$ is achieved as follows. The message polynomial $m(x)=m_{k_{bch}-1}x^{k_{bch}-1}+m_{k_{bch}-2}x^{k_{bch}-2}+\ldots+m_1x+m_0$ is multiplied by $x^{n_{bch}-k_{bch}}$. Next, $x^{n_{bch}-k_{bch}}m(x)$ divided by g(x). With $d(x)=d_{n_{bch}-k_{bch}-1}x^{n_{bch}-k_{bch}-1}+\ldots+d_1x+d_0$ as the remainder, the codeword polynomial is set as follows: $c(x)=x^{n_{bch}-k_{bch}}m(x)+d(x)$.

The above LDPC codes, in an exemplary embodiment, can be used to variety of digital video applications, such as MPEG (Motion Pictures Expert Group) packet transmission.

Figure 3:
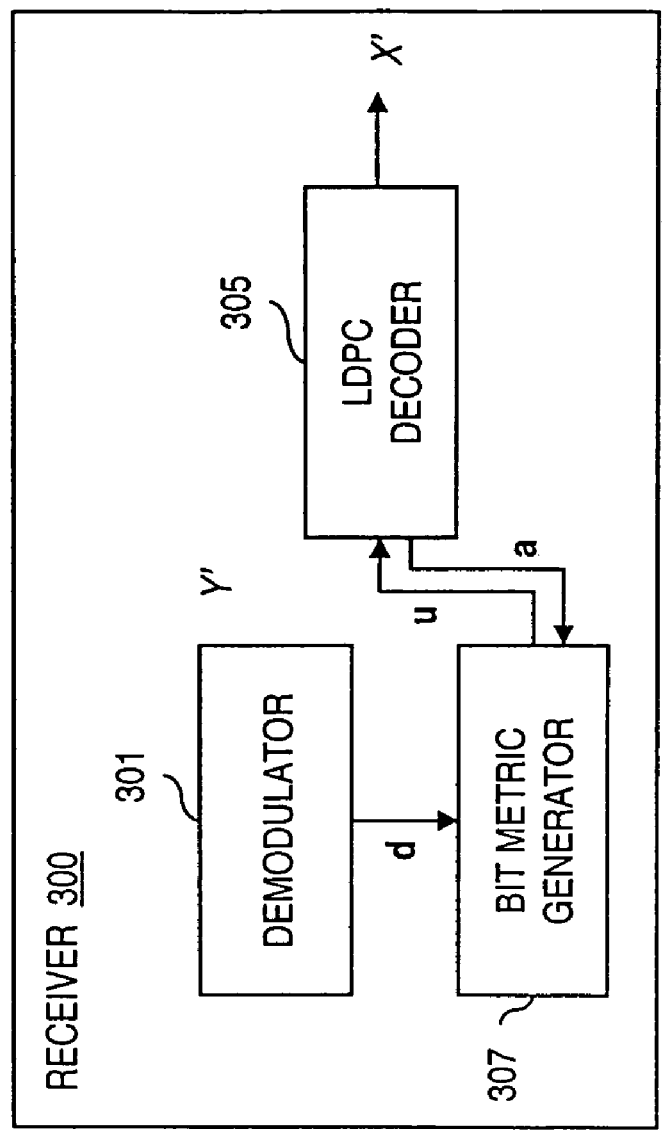
FIG. 3 is a diagram of an exemplary receiver in the system of FIG. 1.

FIG. 3 is a diagram of an exemplary receiver in the system of FIG. 1. At the receiving side, a receiver 300 includes a demodulator 301 that performs demodulation of received signals from transmitter 200. These signals are received at a receive antenna 303 for demodulation. After demodulation, the received signals are forwarded to a decoder 305, which attempts to reconstruct the original source messages by generating messages, X', in conjunction with a bit metric generator 307. With non-Gray mapping, the bit metric generator 307 exchanges probability information with the decoder 305 back and forth (iteratively) during the decoding process, which is detailed in FIG. 10. Alternatively, if Gray mapping is used (according to one embodiment of the present invention), one pass of the bit metric generator is sufficient, in which further attempts of bit metric generation after each LDPC decoder iteration are likely to yield limited performance improvement; this approach is more fully described with respect to FIG. 11. To appreciate the advantages offered by the present invention, it is instructive to examine how LDPC codes are generated, as discussed in FIG. 4.

FIG. 4 is a diagram of a sparse parity check matrix, in accordance with an embodiment of the present invention. LDPC codes are long, linear block codes with sparse parity check matrix $H_{(n-k)\times n}$. Typically the block length, n, ranges from thousands to tens of thousands of bits. For example, a parity check matrix for an LDPC code of length n=8 and rate 1/2 is shown in FIG. 4. The same code can be equivalently represented by the bipartite graph, per FIG. 5.

FIG. 5 is a diagram of a bipartite graph of an LDPC code of the matrix of FIG. 4. Parity check equations imply that for each check node, the sum (over GF (Galois Field)(2)) of all adjacent bit nodes is equal to zero. As seen in the figure, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

Returning the receiver 303, the LDPC decoder 305 is considered a message passing decoder, whereby the decoder 305 aims to find the values of bit nodes. To accomplish this task, bit nodes and check nodes iteratively communicate with each other. The nature of this communication is described below.

From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$, then $m_1$ would indicate to $n_1$ that the value of $n_1$ is believed to be 0 (since $n_1+n_4+n_5+n_8=0$); otherwise $m_1$ indicate to $n_1$ that the value of $n_1$ is believed to be 1. Additionally, for soft decision decoding, a reliability measure is added.

From bit nodes to check nodes, each bit node relays to an adjacent check node an estimate about its own value based on the feedback coming from its other adjacent check nodes. In the above example $n_1$ has only two adjacent check nodes $m_1$ and $m_3$. If the feedback coming from $m_3$ to $n_1$ indicates that the value of $n_1$ is probably 0, then $n_1$ would notify $m_1$ that an estimate of $n_1$'s own value is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

FIG. 6 is a diagram of a sub-matrix of a sparse parity check matrix, wherein the sub-matrix contains parity check values restricted to the lower triangular region, according to an embodiment of the present invention. As described previously, the encoder 203 (of FIGS. 2A and 2B) can employ a simple encoding technique by restricting the values of the lower triangular area of the parity check matrix. According to an embodiment of the present invention, the restriction imposed on the parity check matrix is of the form:

$$H_{(n-k)\times n}=[A_{(n-k)\times k}B_{(n-k)\times(n-k)}],$$

where B is lower triangular.

Any information block $i=(i_0, i_1, \ldots, i_{k-1})$ is encoded to a codeword $c=(i_0, i_1, \ldots, i_{k-1}, p_0, p_1, \ldots p_{n-k-1})$ using $Hc^T=0$, and recursively solving for parity bits; for example, $a_{00}i_0+a_{01}i_1+\ldots+a_{0,k-1}i_{k-1}+p_0=0 \Rightarrow$ Solve $p_0$ $a_{10}i_0+a_{11}i_1+\ldots+a_{1,k-1}i_{k-1}+b_{10}p_0+p_1=0 \Rightarrow$ Solve $p_1$ and similarly for $p_2, p_3, \ldots, p_{n-k-1}$.

Figure 7:
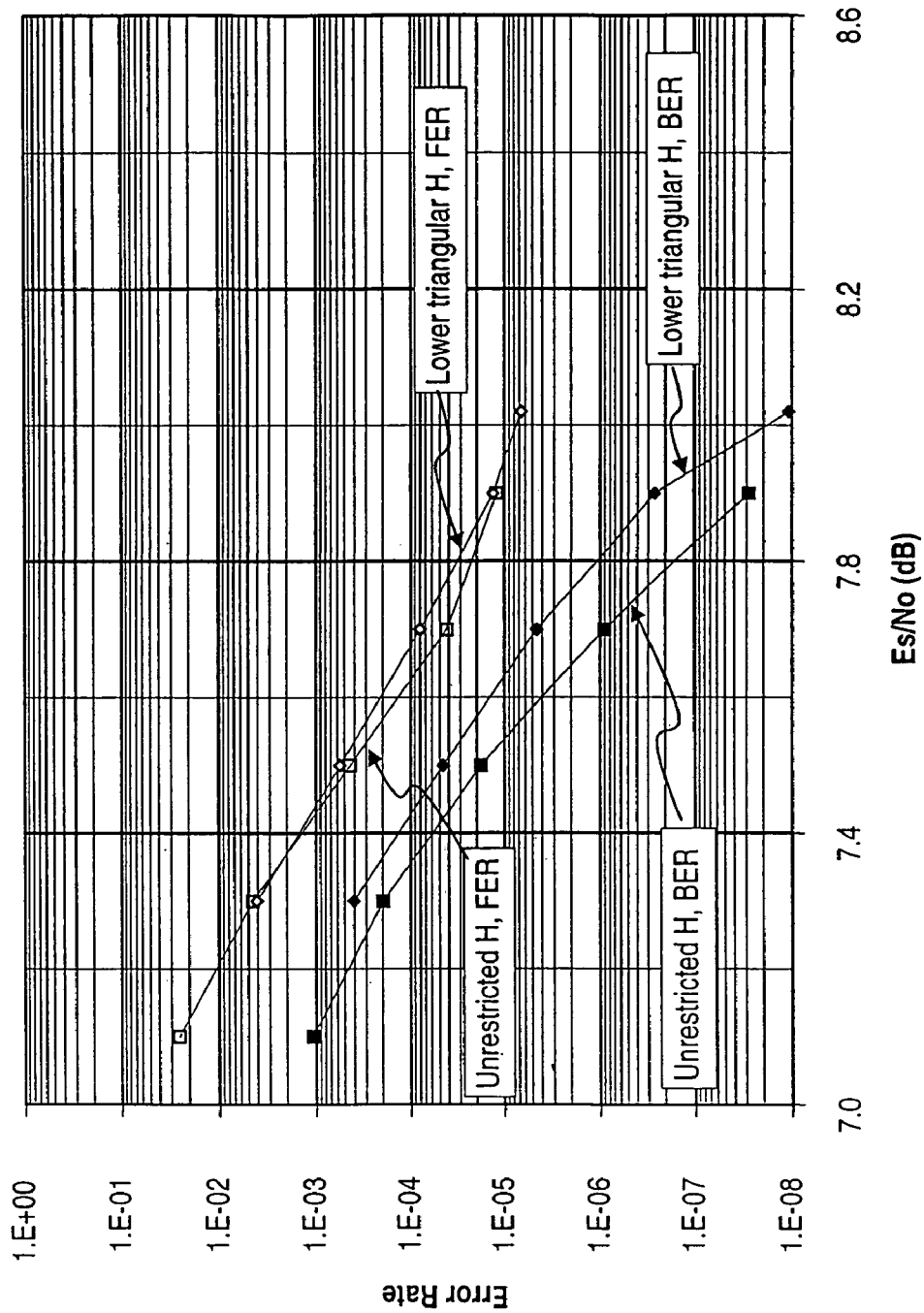
FIG. 7 is a graph showing performance between codes utilizing unrestricted parity check matrix (H matrix) versus restricted H matrix having a sub-matrix as in FIG. 6.

FIG. 7 is a graph showing performance between codes utilizing unrestricted parity check matrix (H matrix) versus restricted H matrix of FIG. 6. The graph shows the performance comparison between two LDPC codes: one with a general parity check matrix and the other with a parity check matrix restricted to be lower triangular to simplify encoding. The modulation scheme, for this simulation, is 8-PSK. The performance loss is within 0.1 dB. Therefore, the performance loss is negligible based on the restriction of the lower triangular H matrices, while the gain in simplicity of the encoding technique is significant. Accordingly, any parity check matrix that is equivalent to a lower triangular or upper triangular under row and/or column permutation can be utilized for the same purpose.

FIGS. 8A and 8B are, respectively, a diagram of a non-Gray 8-PSK modulation scheme, and a Gray 8-PSK modulation, each of which can be used in the system of FIG. 1. The non-Gray 8-PSK scheme of FIG. 8A can be utilized in the receiver of FIG. 3 to provide a system that requires very low Frame Erasure Rate (FER). This requirement can also be satisfied by using a Gray 8-PSK scheme, as shown in FIG. 8B, in conjunction with an outer code, such as Bose, Chaudhuri, and Hocquenghem (BCH), Hamming, or Reed-Solomon (RS) code.

Under this scheme, there is no need to iterate between the LDPC decoder 305 (FIG. 3) and the bit metric generator 307, which may employ 8-PSK modulation. In the absence of an outer code, the LDPC decoder 305 using Gray labeling exhibit an earlier error floor, as shown in FIG. 9 below.

Figure 9:
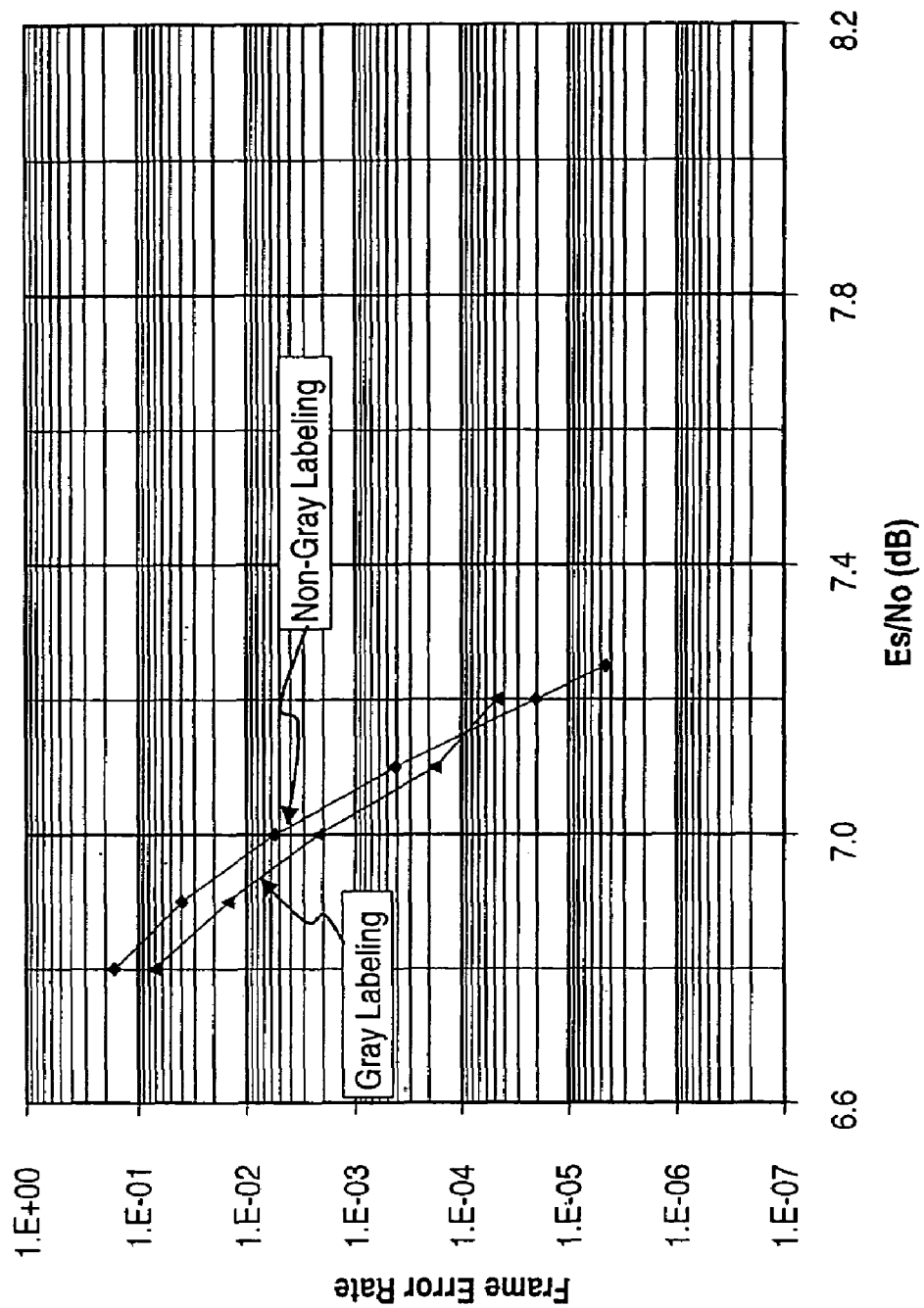
FIG. 9 is a graph showing performance between codes utilizing Gray labeling versus non-Gray labeling.

FIG. 9 is a graph showing performance between codes utilizing Gray labeling versus non-Gray labeling of FIGS. 8A and 8B. The error floor stems from the fact that assuming correct feedback from LDPC decoder 305, regeneration of 8-PSK bit metrics is more accurate with non-Gray labeling since the two 8-PSK symbols with known two bits are further apart with non-Gray labeling. This can be equivalently seen as operating at higher Signal-to-Noise Ratio (SNR). Therefore, even though error asymptotes of the same LDPC code using Gray or non-Gray labeling have the same slope (i.e., parallel to each other), the one with non-Gray labeling passes through lower FER at any SNR.

On the other hand, for systems that do not require very low FER, Gray labeling without any iteration between LDPC decoder 305 and 8-PSK bit metric generator 307 may be more suitable because re-generating 8-PSK bit metrics before every LDPC decoder iteration causes additional complexity. Moreover, when Gray labeling is used, re-generating 8-PSK bit metrics before every LDPC decoder iteration yields only very slight performance improvement. As mentioned previously, Gray labeling without iteration may be used for systems that require very low FER, provided an outer code is implemented.

The choice between Gray labeling and non-Gray labeling depends also on the characteristics of the LDPC code. Typically, the higher bit or check node degrees, the better it is for Gray labeling, because for higher node degrees, the initial feedback from LDPC decoder 305 to 8-PSK (or similar higher order modulation) bit metric generator 307 deteriorates more with non-Gray labeling.

When 8-PSK (or similar higher order) modulation is utilized with a binary decoder, it is recognized that the three (or more) bits of a symbol are not received "equally noisy". For example with Gray 8-PSK labeling, the third bit of a symbol is considered more noisy to the decoder than the other two bits. Therefore, the LDPC code design does not assign a small number of edges to those bit nodes represented by "more noisy" third bits of 8-PSK symbol so that those bits are not penalized twice.

Figure 10:
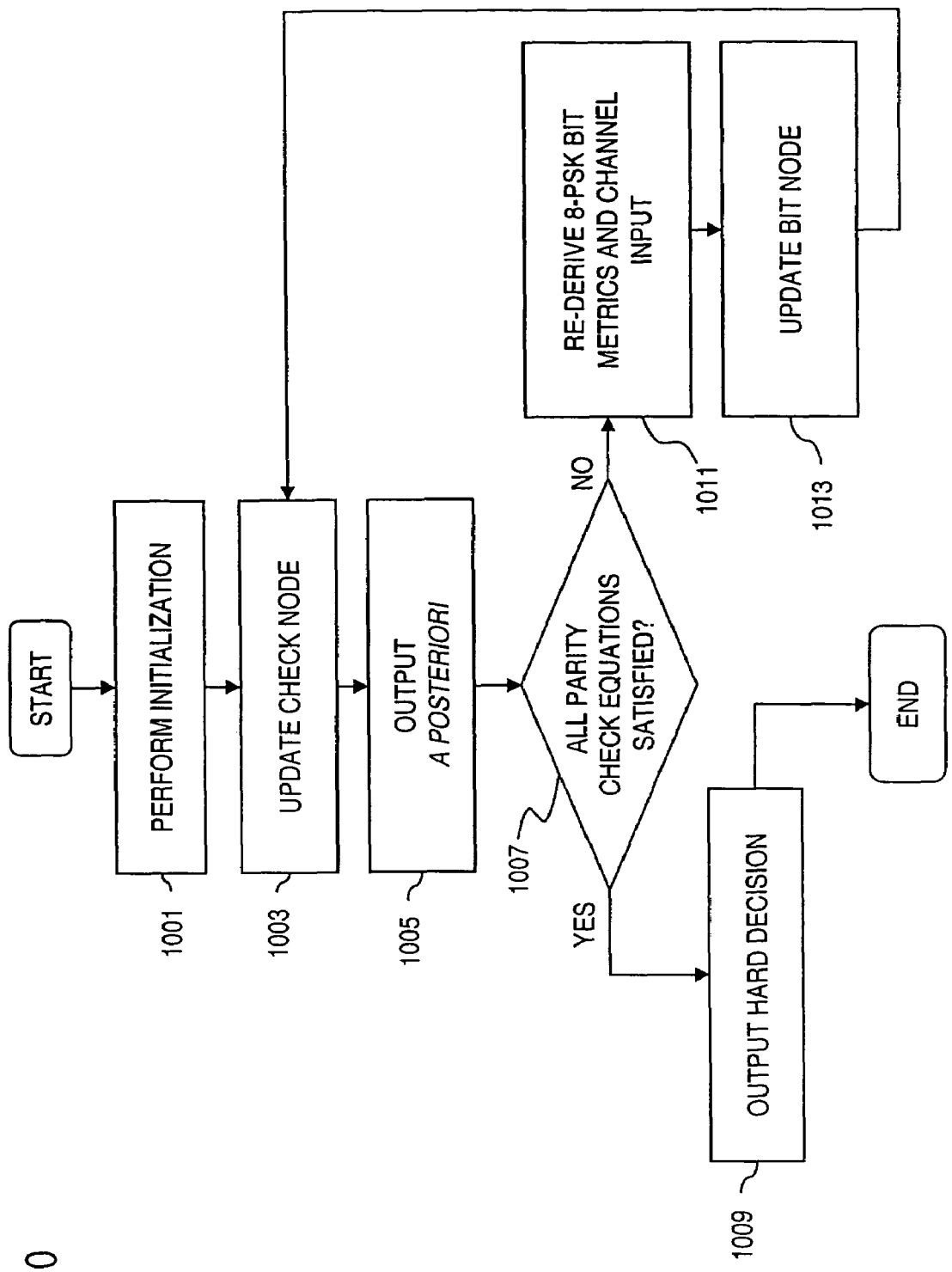
FIG. 10 is a flow chart of the operation of the LDPC decoder using non-Gray mapping, according to an embodiment of the present invention.

FIG. 10 is a flow chart of the operation of the LDPC decoder using non-Gray mapping, according to an embodiment of the present invention. Under this approach, the LDPC decoder and bit metric generator iterate one after the other. In this example, 8-PSK modulation is utilized; however, the same principles apply to other higher modulation schemes as well. Under this scenario, it is assumed that the demodulator 301 outputs a distance vector, d, denoting the distances between received noisy symbol points and 8-PSK symbol points to the bit metric generator 307, whereby the vector components are as follows:

$$d_i = -\frac{E_s}{N_0}\{(r_x - s_{i,x})^2 + (r_y - s_{i,y})^2\} \quad i = 0, 1, \ldots 7.$$

The 8-PSK bit metric generator 307 communicates with the LDPC decoder 305 to exchange a priori probability information and a posteriori probability information, which respectively are represented as u, and a. That is, the vectors u and a respectively represent a priori and a posteriori probabilities of log likelihood ratios of coded bits.

The 8-PSK bit metric generator 307 generates the a priori likelihood ratios for each group of three bits as follows. First, extrinsic information on coded bits is obtained:

$$e_j = a_j - u_j \; j=0, 1, 2.$$

Next, 8-PSK symbol probabilities, $p_i$ $i=0, 1, \ldots, 7$, are determined.

\*$y_j = -f(0,e_j)$ j=0, 1, 2 where $f(a,b)=\max(a,b)+LUT_f$ $(a,b)$ with $$LUT_f(a,b)=\ln(1+e^{-|a-b|})$$

\*$x_j = y_j + e_j$ j=0,1,2

\*$p_0 = x_0 + x_1 + x_2 \, p_4 = y_0 + x_1 + x_2$ $p_1 = x_0 + x_1 + y_2 \, p_5 = y_0 + x_1 + y_2$ $p_2 = x_0 + y_1 + x_2 \, p_6 = y_0 + y_1 + x_2$ $p_3 = x_0 + y_1 + y_2 \, p_7 = y_0 + y_1 + y_2$

Next, the bit metric generator 307 determines a priori log likelihood ratios of the coded bits as input to LDPC decoder 305, as follows:

$u_0 = f(d_0 + p_0, d_1 + p_1, d_2 + p_2, d_3 + p_3) - f(d_4 + p_4, d_5 + p_5, d_6 + p_6, d_7 + p_7) - e_0$ $u_1 = f(d_0 + p_0, d_1 + p_1, d_4 + p_4, d_5 + p_5) - f(d_2 + p_2, d_3 + p_3, d_6 + p_6, d_7 + p_7) - e_1$ $u_2 = f(d_0 + p_0, d_2 + p_2, d_4 + p_4, d_6 + p_6) - f(d_1 + p_1, d_3 + p_3, d_5 + p_5, d_7 + p_7) - e_2$

It is noted that the function $f(.)$ with more than two variables can be evaluated recursively; e.g. $f(a,b,c)=f(f(a,b),c)$.

Figures 12A, 12B, 12C:
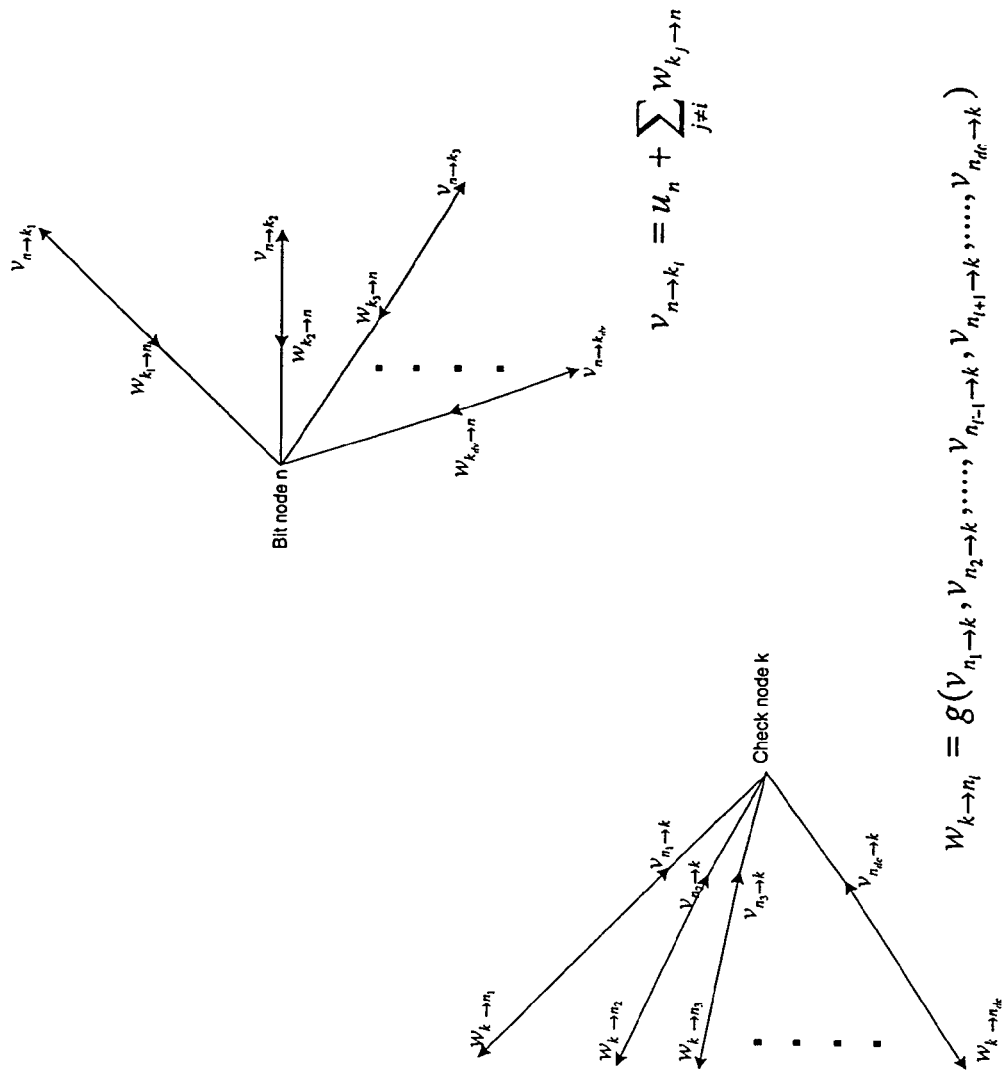
FIGS. 12A-12C are diagrams of the interactions between the check nodes and the bit nodes in a decoding process, according to an embodiment of the present invention.

The operation of the LDPC decoder 305 utilizing non-Gray mapping is now described. In step 1001, the LDPC decoder 305 initializes log likelihood ratios of coded bits, v, before the first iteration according to the following (and as shown in FIG. 12A):

$$v_{n \to k_i} = u_n, \; n=0, 1, \ldots, N-1, \; i=1, 2, \ldots, \text{deg(bit node } n)$$

Here, $v_{n \to k_i}$ denotes the message that goes from bit node n to its adjacent check node $k_i$, $u_n$ denotes the demodulator output for the bit n and N is the codeword size.

In step 1003, a check node, k, is updated, whereby the input v yields the output w. As seen in FIG. 12B, the incoming messages to the check node k from its $d_c$ adjacent bit nodes are denoted by $v_{n_1 \to k}, v_{n_2 \to k}, \ldots, v_{n_{dc} \to k}$. The goal is to compute the outgoing messages from the check node k back to $d_c$ adjacent bit nodes. These messages are denoted by $$w_{k \to n_1}, w_{k \to n_2}, \ldots w_{k \to n_{dc}}, \text{ where}$$

$$w_{k \to n_i} = g(v_{n_1 \to k}, v_{n_2 \to k}, \ldots, v_{n_{i-1} \to k}, v_{n_{i+1} \to k}, \ldots, v_{n_{dc} \to k}).$$

The function g( ) is defined as follows:

$$g(a,b) = \text{sign}(a) \times \text{sign}(b) \times \{\min(|a|,|b|)\} + LUT_g(a,b),$$

where $LUT_g(a,b) = \ln(1+e^{-|a+b|}) - \ln(1+e^{-|a-b|})$. Similar to function $f$, function g with more than two variables can be evaluated recursively.

Next, the decoder 305, per step 1205, outputs a posteriori probability information (FIG. 12C), such that:

$$a_n = u_n + \sum_j w_{k_j \to n}.$$

Per step 1007, it is determined whether all the parity check equations are satisfied. If these parity check equations are not satisfied, then the decoder 305, as in step 1009, re-derives 8-PSK bit metrics and channel input $u_n$. Next, the bit node is updated, as in step 1011. As shown in FIG. 14C, the incoming messages to the bit node n from its $d_v$ adjacent check nodes are denoted by $w_{k_1 \to n}, w_{k_2 \to n}, \ldots, w_{k_{dv} \to n}$. The outgoing messages from the bit node n are computed back to $d_v$ adjacent check nodes; such messages are denoted by $v_{n \to k_1}, v_{n \to k_2}, \ldots, v_{n \to k_{dv}}$, and computed as follows:

$$v_{n \to k_i} = u_n + \sum_{j \neq i} w_{k_j \to n}.$$

In step 1013, the decoder 305 outputs the hard decision (in the case that all parity check equations are satisfied):

$$\hat{c}_n = \begin{cases} 0, & a_n \geq 0 \\ 1, & a_n < 0 \end{cases} \quad \text{Stop if } H\hat{c}^T = 0$$

The above approach is appropriate when non-Gray labeling is utilized. However, when Gray labeling is implemented, the process of FIG. 11 is executed.

Figure 11:
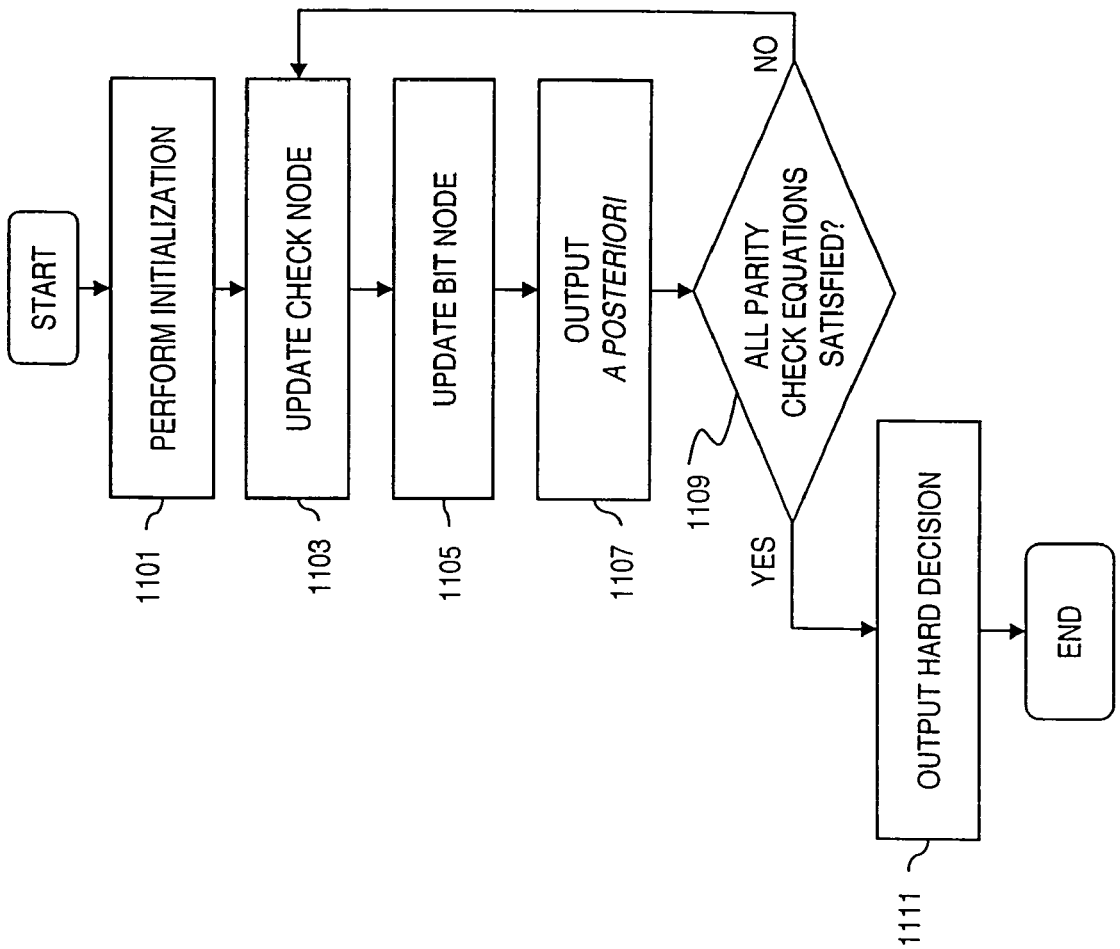
FIG. 11 is a flow chart of the operation of the LDPC decoder of FIG. 3 using Gray mapping, according to an embodiment of the present invention.

FIG. 11 is a flow chart of the operation of the LDPC decoder of FIG. 3 using Gray mapping, according to an embodiment of the present invention. When Gray labeling is used, bit metrics are advantageously generated only once before the LDPC decoder, as re-generating bit metrics after every LDPC decoder iteration may yield nominal performance improvement. As with steps 1001 and 1003 of FIG. 10, initialization of the log likelihood ratios of coded bits, v, are performed, and the check node is updated, per steps 1101 and 1103. Next, the bit node n is updated, as in step 1105. Thereafter, the decoder outputs the a posteriori probability information (step 1107). In step 1109, a determination is made whether all of the parity check equations are satisfied; if so, the decoder outputs the hard decision (step 1111). Otherwise, steps 1103-1107 are repeated.

Figure 13B:
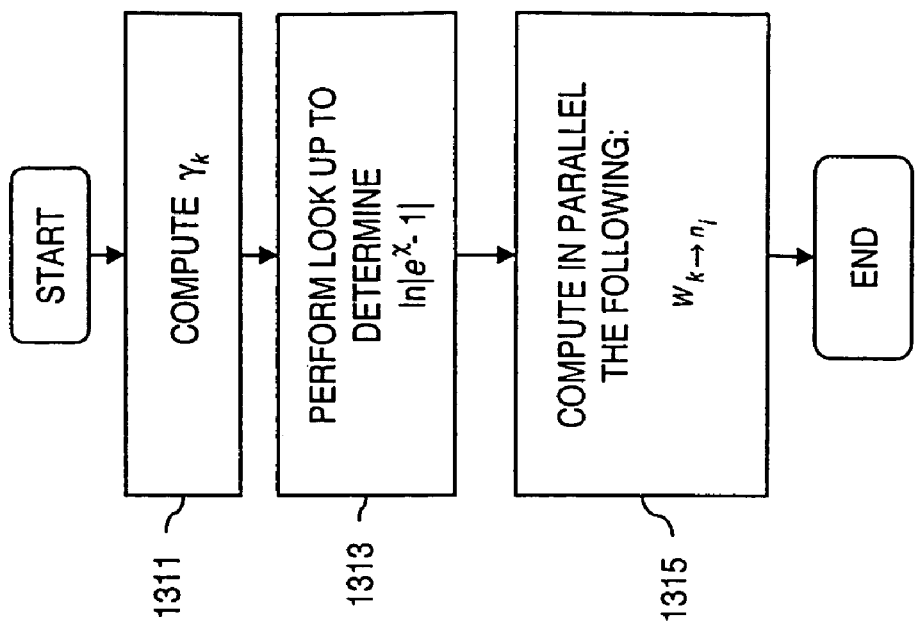
FIGS. 13A and 13B are flowcharts of processes for computing outgoing messages between the check nodes and the bit nodes using, respectively, a forward-backward approach and a parallel approach, according to various embodiments of the present invention.
Figure 13A:
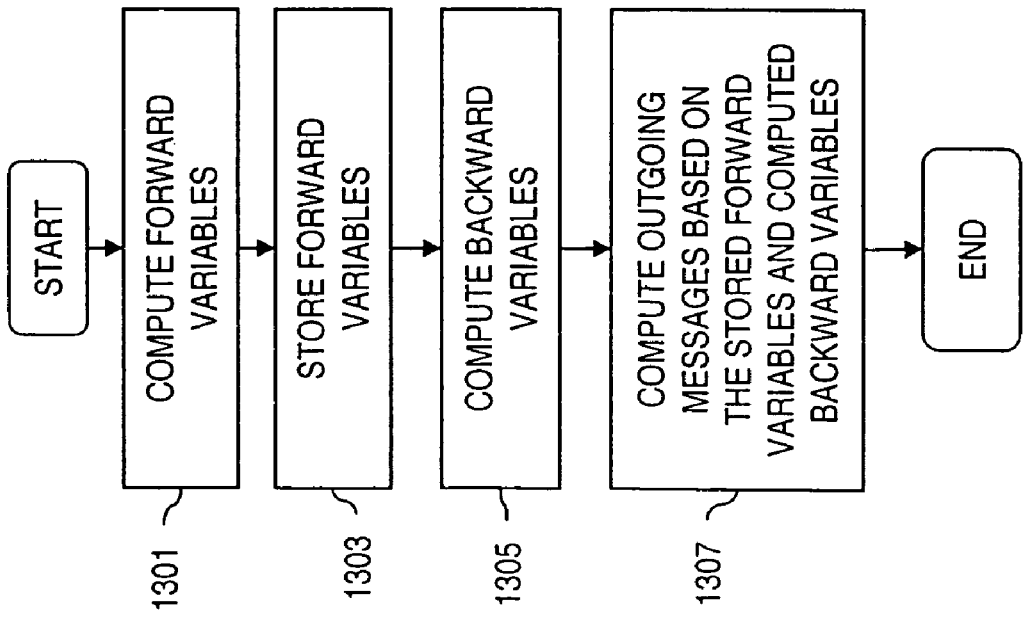

FIG. 13A is a flowchart of process for computing outgoing messages between the check nodes and the bit nodes using a forward-backward approach, according to an embodiment of the present invention. For a check node with $d_c$ adjacent edges, the computation of $d_c(d_c-1)$ and numerous $g(.,.)$ functions are performed. However, the forward-backward approach reduces the complexity of the computation to $3(d_c-2)$, in which $d_c-1$ variables are stored.

Referring to FIG. 12B, the incoming messages to the check node k from $d_c$ adjacent bit nodes are denoted by $v_{n_1 \to k}, v_{n_2 \to k}, \ldots, v_{n_{dc} \to k}$. It is desired that the outgoing messages are computed from the check node k back to $d_c$ adjacent bit nodes; these outgoing messages are denoted by $w_{k \to n_1}, w_{k \to n_2}, \ldots, w_{k \to n_{dc}}$.

Under the forward-backward approach to computing these outgoing messages, forward variables, $f_1, f_2, \ldots, f_{dc}$, are defined as follows:

$$f_1 = v_{1 \to k}$$
$$f_2 = g(f_1, v_{2 \to k})$$
$$f_3 = g(f_2, v_{3 \to k})$$
$$\vdots$$
$$f_{dc} = g(f_{dc-1}, v_{dc \to k})$$

In step 1301, these forward variables are computed, and stored, per step 1303.

Similarly, backward variables, $b_1, b_2, \ldots, b_{dc}$, are defined by the following:

$$b_{dc} = v_{dc \to k}$$
$$b_{dc-1} = g(b_{dc}, v_{dc-1 \to k})$$
$$\vdots$$
$$b_1 = g(b_2, v_{1 \to k})$$

In step 1305, these backward variables are then computed. Thereafter, the outgoing messages are computed, as in step 1307, based on the stored forward variables and the computed backward variables. The outgoing messages are computed as follows:

$$w_{k \to 1} = b_2$$
$$w_{k \to i} = g(f_{i-1}, b_{i+1}) \; i=2, 3, \ldots, d_c-1$$
$$w_{k \to dc} = f_{dc-1}$$

Under this approach, only the forward variables, $f_2, f_3, \ldots, f_{dc}$, are required to be stored. As the backward variables $b_i$ are computed, the outgoing messages, $w_{k \to i}$, are simultaneously computed, thereby negating the need for storage of the backward variables.

The computation load can be further enhance by a parallel approach, as next discussed.

FIG. 13B is a flowchart of process for computing outgoing messages between the check nodes and the bit nodes using a parallel approach, according to an embodiment of the present invention. For a check node k with inputs $v_{n_1 \to k}, v_{n_2 \to k}, \ldots, v_{n_{dc} \to k}$ from $d_c$ adjacent bit nodes, the following parameter is computed, as in step 1311:

$$\gamma_k = g(v_{n_1 \to k}, v_{n_2 \to k}, \ldots, v_{n_{dc} \to k}).$$

It is noted that the $g(.,.)$ function can also be expressed as follows:

$$g(a, b) = \ln \frac{1 + e^{a+b}}{e^a + e^b}.$$

Exploiting the recursive nature of the $g(.,.)$ function, the following expression results:

$$\gamma_k = \ln \frac{1 + e^{g(v_{n_1 \to k}, \ldots, v_{n_{i-1} \to k}, v_{n_{i+1} \to k}, \ldots, v_{n_{dc} \to k}) + v_{n_i \to k}}}{e^{g(v_{n_1 \to k}, \ldots, v_{n_{i-1} \to k}, v_{n_{i+1} \to k}, \ldots, v_{n_{dc} \to k})} + e^{v_{n_i \to k}}} = \ln \frac{1 + e^{w_{k \to n_i} + v_{n_i \to k}}}{e^{w_{k \to n_i}} e^{v_{n_i \to k}}}$$

Accordingly, $w_{k \to n_i}$ can be solved in the following manner:

$$w_{k \to n_i} = \ln \frac{e^{v_{n_i \to k} + \gamma_k} - 1}{e^{v_{n_i \to k} - \gamma_k} - 1} - \gamma_k$$

The ln(.) term of the above equation can be obtained using a look-up table $LUT_x$ that represents the function $\ln|e^x - 1|$ (step 1313). Unlike the other look-up tables $LUT_f$ or $LUT_g$, the table $LUT_x$ would likely requires as many entries as the number of quantization levels. Once $\gamma_k$ is obtained, the calculation of $w_{k \to n_i}$ for all $n_i$ can occur in parallel using the above equation, per step 1315.

The computational latency of $\gamma_k$ is advantageously $\log_2 (d_c)$.

Figure 14A:
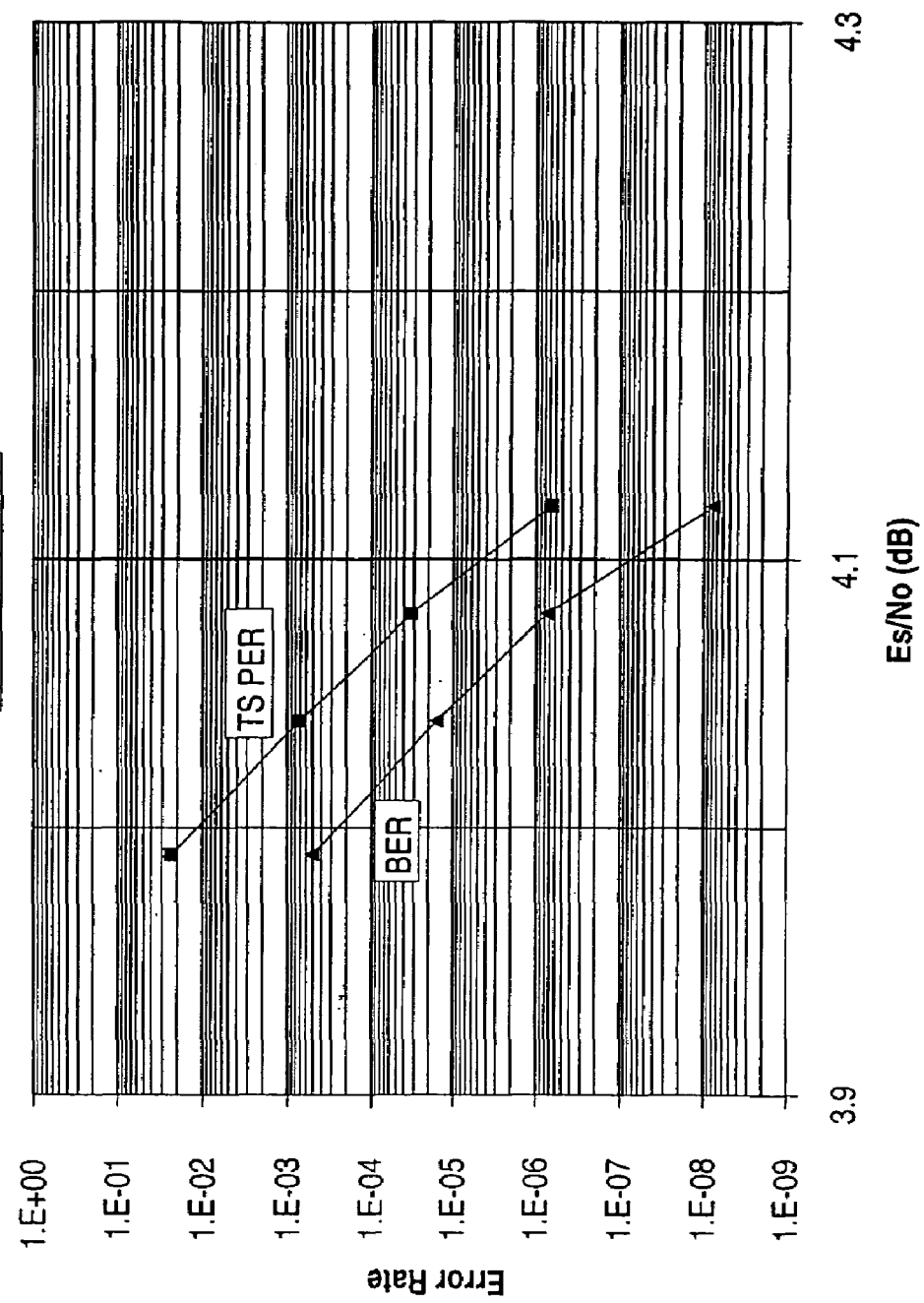
FIGS. 14A-14C are graphs showing simulation results of LDPC codes generated in accordance with various embodiments of the present invention.
Figure 14B:
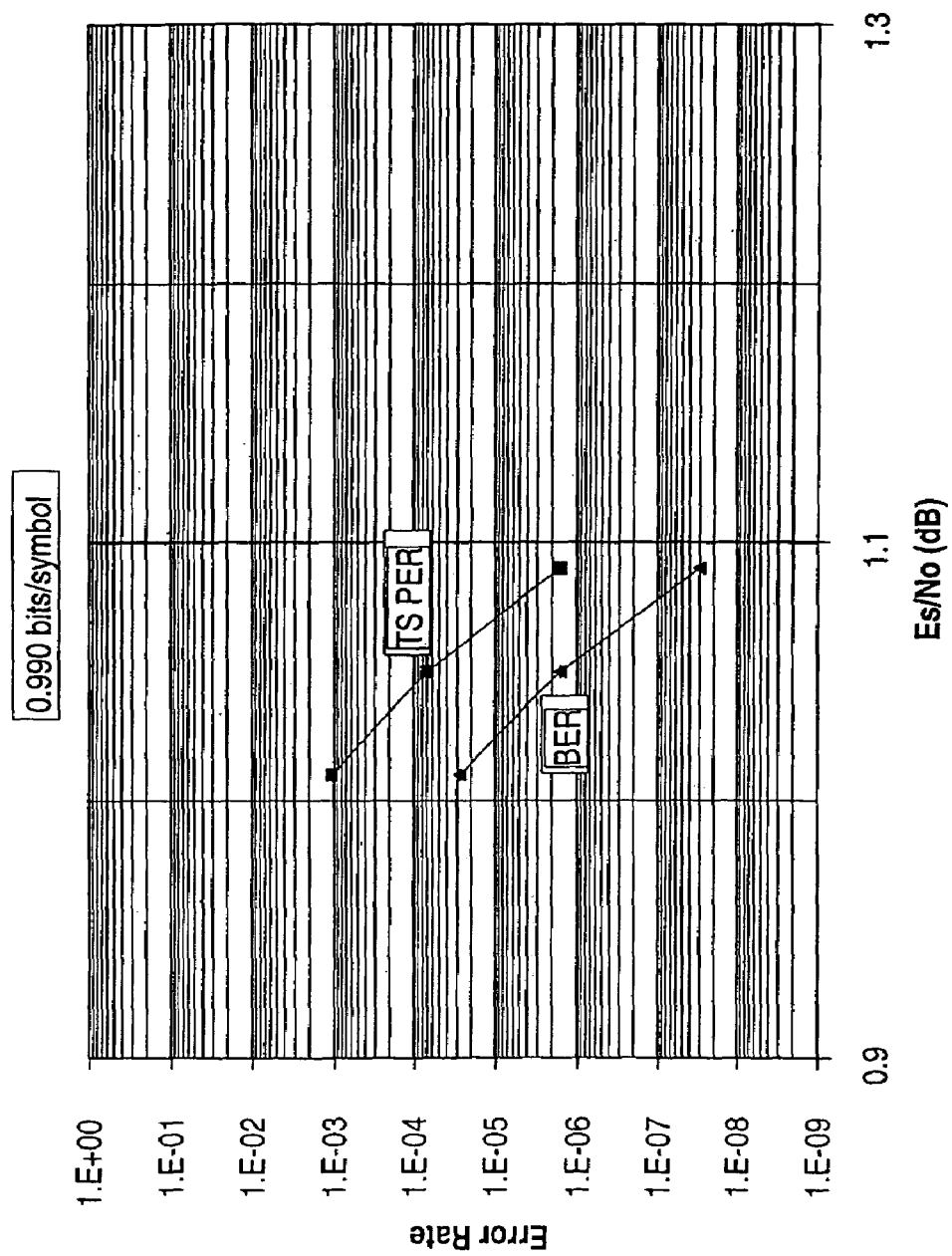
Figure 14C:
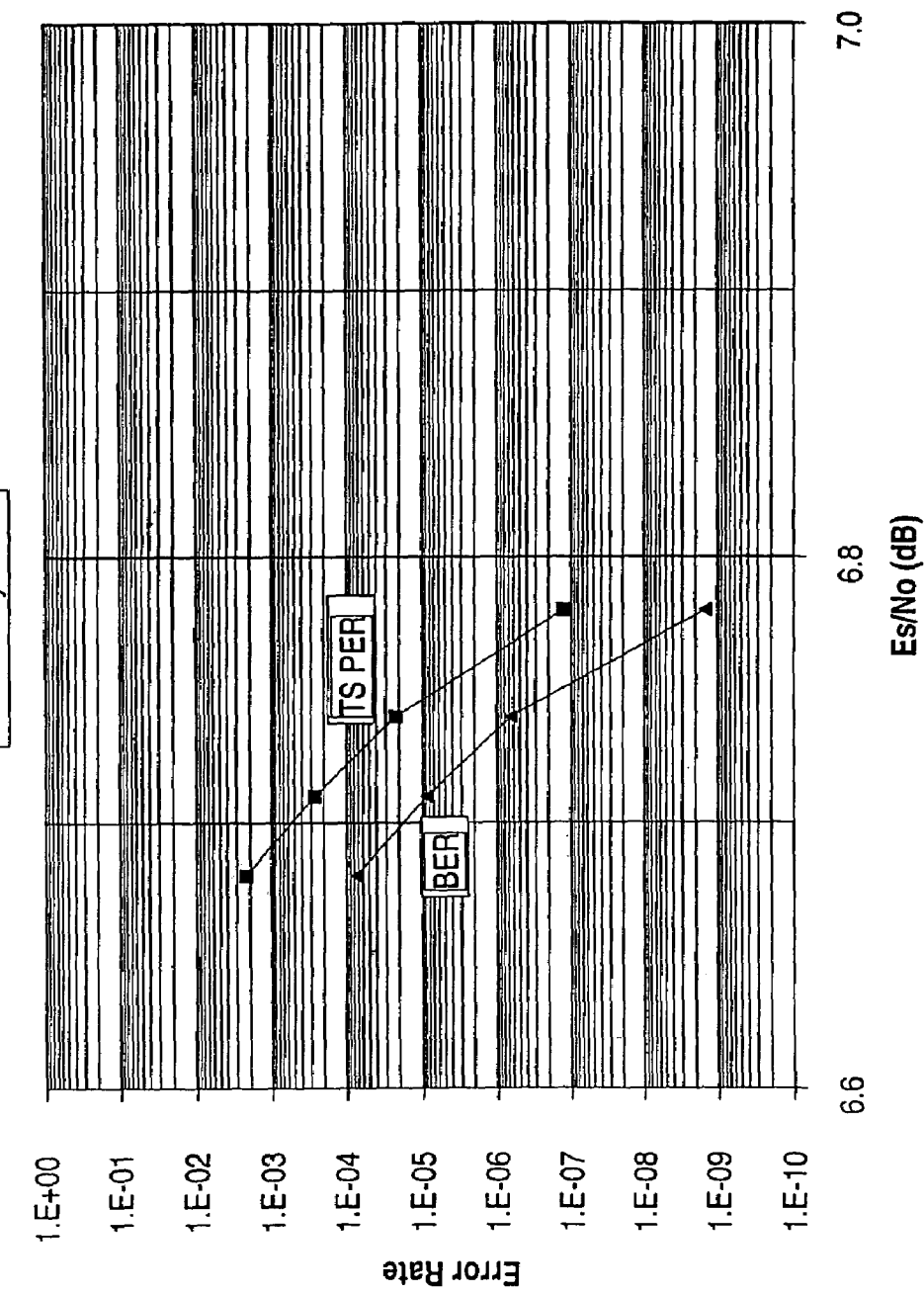

FIGS. 14A-14C are graphs showing simulation results of LDPC codes generated in accordance with various embodiments of the present invention. In particular, FIGS. 14A-14C show the performance of LDPC codes with higher order modulation and code rates of 3/4 (QPSK, 1.485 bits/symbol), 2/3 (8-PSK, 1.980 bits/symbol), and 5/6 (8-PSK, 2.474 bits/symbol).

Two general approaches exist to realize the interconnections between check nodes and bit nodes: (1) a fully parallel approach, and (2) a partially parallel approach. In fully parallel architecture, all of the nodes and their interconnections are physically implemented. The advantage of this architecture is speed.

The fully parallel architecture, however, may involve greater complexity in realizing all of the nodes and their connections. Therefore with fully parallel architecture, a smaller block size may be required to reduce the complexity. In that case, for the same clock frequency, a proportional reduction in throughput and some degradation in FER versus Es/No performance may result.

The second approach to implementing LDPC codes is to physically realize only a subset of the total number of the nodes and use only these limited number of "physical" nodes to process all of the "functional" nodes of the code. Even though the LDPC decoder operations can be made extremely simple and can be performed in parallel, the further challenge in the design is how the communication is established between "randomly" distributed bit nodes and check nodes. The decoder 305 (of FIG. 3), according to one embodiment of the present invention, addresses this problem by accessing memory in a structured way, as to realize a seemingly random code. This approach is explained with respect to FIGS. 15A and 15B.

Figure 15A:
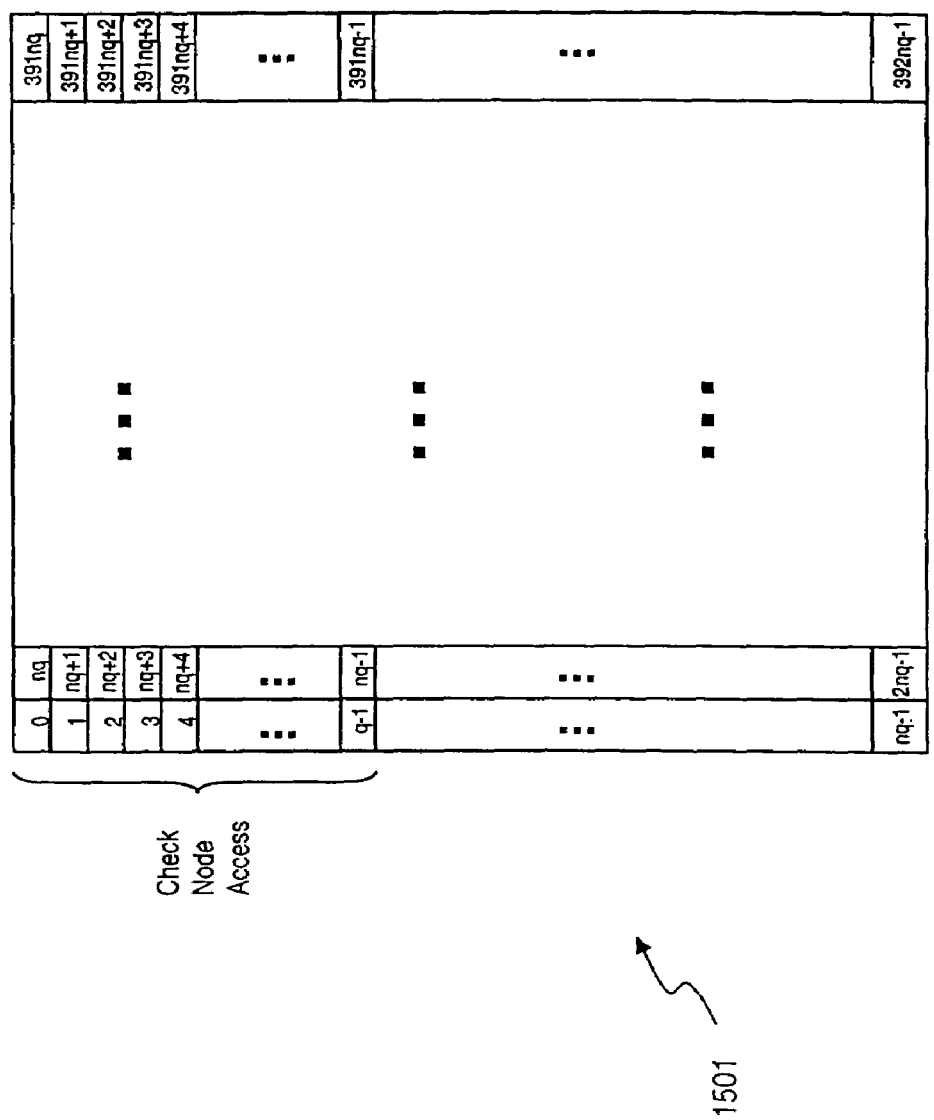
FIGS. 15A and 15B are diagrams of the top edge and bottom edge, respectively, of memory organized to support structured access as to realize randomness in LDPC coding, according to an embodiment of the present invention.
Figure 15B:
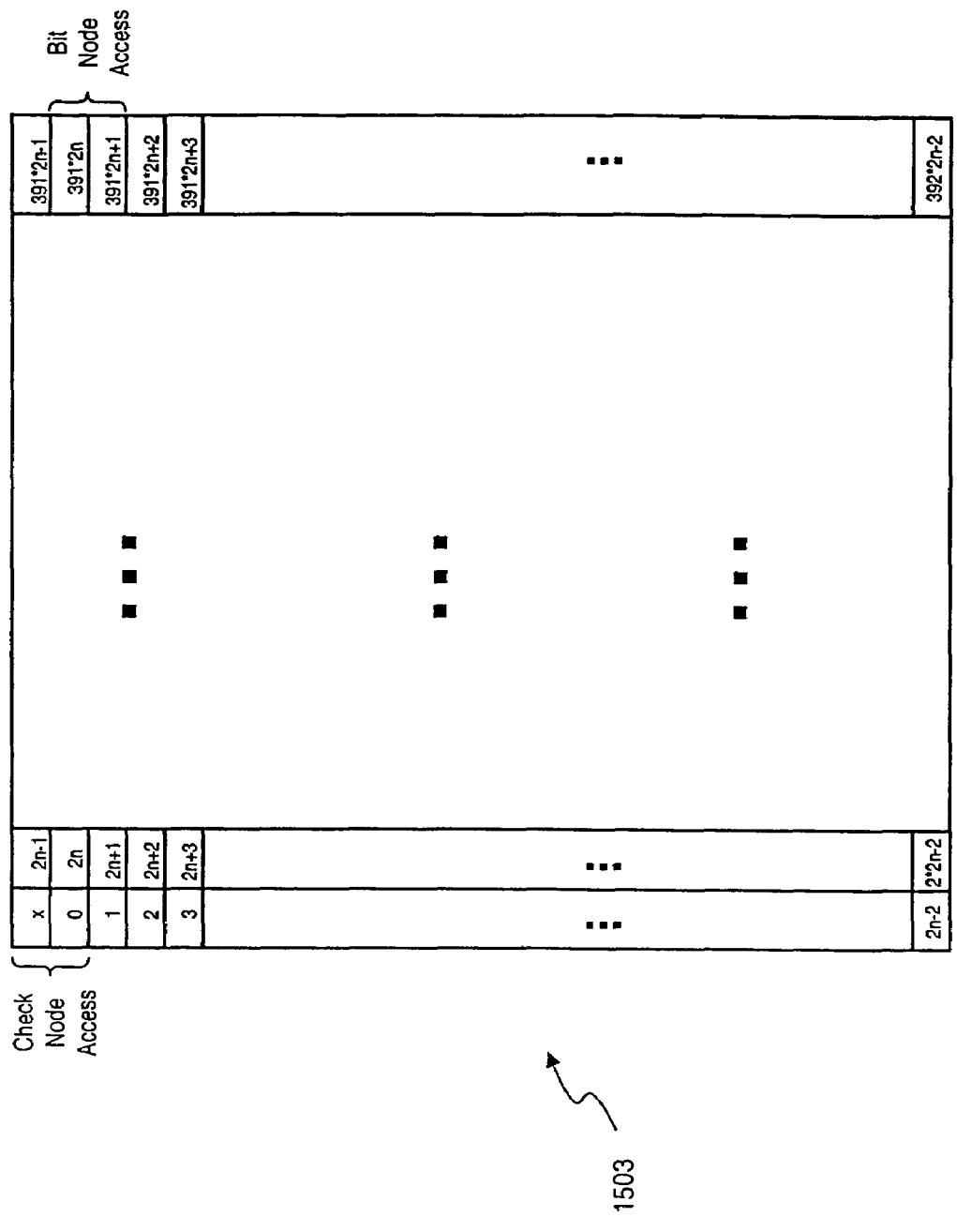

FIGS. 15A and 15B are diagrams of the top edge and bottom edge, respectively, of memory organized to support structured access as to realize randomness in LDPC coding, according to an embodiment of the present invention. Structured access can be achieved without compromising the performance of a truly random code by focusing on the generation of the parity check matrix. In general, a parity check matrix can be specified by the connections of the check nodes with the bit nodes. For example, the bit nodes can be divided into groups of a fixed size, which for illustrative purposes is 392. Additionally, assuming the check nodes connected to the first bit node of degree 3, for instance, are numbered as a, b and c, then the check nodes connected to the second bit node are numbered as a+p, b+p and c+p, the check nodes connected to the third bit node are numbered as a+2p, b+2p and c+2p etc.; where p=(number of check nodes)/392. For the next group of 392 bit nodes, the check nodes connected to the first bit node are different from a, b, c so that with a suitable choice of p, all the check nodes have the same degree. A random search is performed over the free constants such that the resulting LDPC code is cycle-4 and cycle-6 free. Because of the structural characteristics of the parity check matrix of the present invention, the edge information can stored to permit concurrent access to a group of relevant edge values during decoding.

In other words, the approach of the present invention facilitates memory access during check node and bit node processing. The values of the edges in the bipartite graph can be stored in a storage medium, such as random access memory (RAM). It is noted that for a truly random LDPC code during check node and bit node processing, the values of the edges would need to be accessed one by one in a random fashion. However, such a conventional access scheme would be too slow for a high data rate application. The RAM of FIGS. 15A and 15B are organized in a manner, whereby a large group of relevant edges can be fetched in one clock cycle; accordingly, these values are placed "together" in memory, according to a predetermined scheme or arrangement. It is observed that, in actuality, even with a truly random code, for a group of check nodes (and respectively bit nodes), the relevant edges can be placed next to one another in RAM, but then the relevant edges adjacent to a group of bit nodes (respectively check nodes) will be randomly scattered in RAM. Therefore, the "togetherness," under the present invention, stems from the design of the parity check matrices themselves. That is, the check matrix design ensures that the relevant edges for a group of bit nodes and check nodes are simultaneously placed together in RAM.

As seen in FIGS. 15A and 15B, each box contains the value of an edge, which is multiple bits (e.g., 6). Edge RAM, according to one embodiment of the present invention, is divided into two parts: top edge RAM 1501 (FIG. 15A) and bottom edge RAM 1503 (FIG. 15B). Bottom edge RAM 1503 contains the edges between bit nodes of degree 2, for example, and check nodes. Top edge RAM contains the edges between bit nodes of degree greater than 2 and check nodes. Therefore, for every check node, 2 adjacent edges are stored in the bottom RAM 1503, and the rest of the edges are stored in the top edge RAM 1501. For example, the size of the top edge RAM 1501 and bottom edge RAM 1503 for various code rates are given in Table 14:

TABLE 14

|  | ½ | ⅔ | ¾ | ⅚ |
|---|---|---|---|---|
| Top Edge RAM | 400 × 392 | 440 × 392 | 504 × 392 | 520 × 392 |
| Bottom Edge RAM | 160 × 392 | 110 × 392 | 72 × 392 | 52 × 392 |

Based on Table 14, an edge RAM of size 576×392 is sufficient to store the edge metrics for all the code rates of 1/2, 2/3, 3/4, and 5/6.

As noted, under this exemplary scenario, a group of 392 bit nodes and 392 check nodes are selected for processing at a time. For 392 check node processing, $q=d_c-2$ consecutive rows are accessed from the top edge RAM 1501, and 2 consecutive rows from the bottom edge RAM 1503. The value of $d_c$ depends on the specific code, for example $d_c=7$ for rate 1/2, $d_c=10$ for rate 2/3, $d_c=16$ for rate 3/4 and $d_c=22$ for rate 5/6 for course other values of $d_c$ for other codes are possible. In this instance, q+2 is the degree of each check node.

For bit node processing, if the group of 392 bit nodes has degree 2, their edges are located in 2 consecutive rows of the bottom edge RAM 1503. If the bit nodes have degree d>2, their edges are located in some d rows of the top edge RAM 1501. The address of these d rows can be stored in non-volatile memory, such as Read-Only Memory (ROM). The edges in one of the rows correspond to the first edges of 392 bit nodes, the edges in another row correspond to the second edges of 392 bit nodes, etc. Moreover for each row, the column index of the edge that belongs to the first bit node in the group of 392 can also be stored in ROM. The edges that correspond to the second, third, etc. bit nodes follow the starting column index in a "wrapped around" fashion. For example, if the $j^{th}$ edge in the row belongs to the first bit node, then the (j+1)st edge belongs to the second bit node, (j+2)nd edge belongs to the third bit node, . . . , and (j−1)st edge belongs to the $392^{th}$ bit node.

With the organization shown in FIGS. 15A and 15B, speed of memory access is greatly enhanced during LDPC coding.

Figure 16:
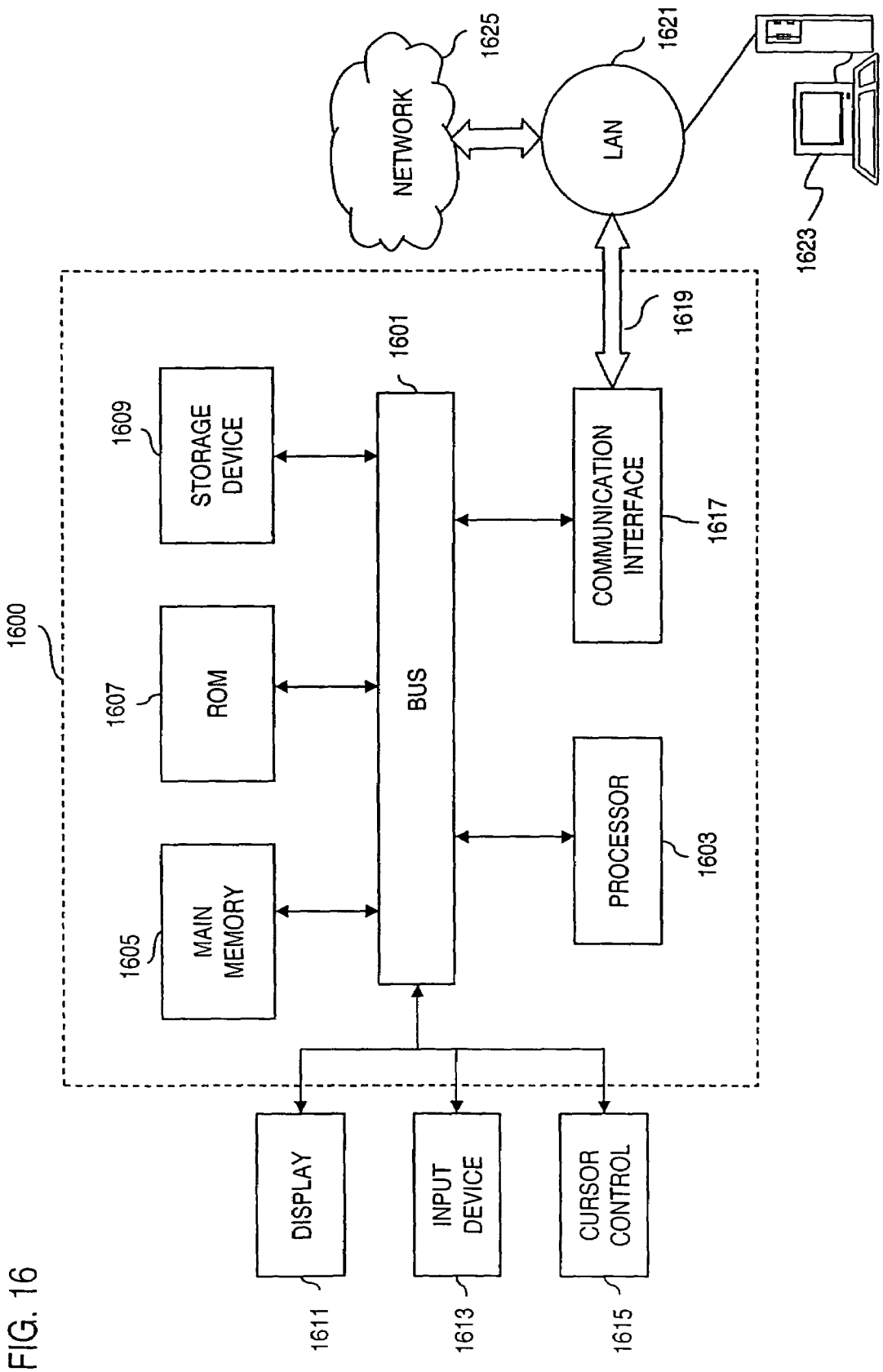
FIG. 16 is a diagram of a computer system that can perform the processes of encoding and decoding of LDPC codes, in accordance with embodiments of the present invention.

FIG. 16 illustrates a computer system upon which an embodiment according to the present invention can be implemented. The computer system 1600 includes a bus 1601 or other communication mechanism for communicating information, and a processor 1603 coupled to the bus 1601 for processing information. The computer system 1600 also includes main memory 1605, such as a random access memory (RAM) or other dynamic storage device, coupled to the bus 1601 for storing information and instructions to be executed by the processor 1603. Main memory 1605 can also be used for storing temporary variables or other intermediate information during execution of instructions to be executed by the processor 1603. The computer system 1600 further includes a read only memory (ROM) 1607 or other static storage device coupled to the bus 1601 for storing static information and instructions for the processor 1603. A storage device 1609, such as a magnetic disk or optical disk, is additionally coupled to the bus 1601 for storing information and instructions.

The computer system 1600 may be coupled via the bus 1601 to a display 1611, such as a cathode ray tube (CRT), liquid crystal display, active matrix display, or plasma display, for displaying information to a computer user. An input device 1613, such as a keyboard including alphanumeric and other keys, is coupled to the bus 1601 for communicating information and command selections to the processor 1603. Another type of user input device is cursor control 1615, such as a mouse, a trackball, or cursor direction keys for communicating direction information and command selections to the processor 1603 and for controlling cursor movement on the display 1611.

According to one embodiment of the invention, generation of LDPC codes is provided by the computer system 1600 in response to the processor 1603 executing an arrangement of instructions contained in main memory 1605. Such instructions can be read into main memory 1605 from another computer-readable medium, such as the storage device 1609. Execution of the arrangement of instructions contained in main memory 1605 causes the processor 1603 to perform the process steps described herein. One or more processors in a multi-processing arrangement may also be employed to execute the instructions contained in main memory 1605. In alternative embodiments, hard-wired circuitry may be used in place of or in combination with software instructions to implement the embodiment of the present invention. Thus, embodiments of the present invention are not limited to any specific combination of hardware circuitry and software.

The computer system 1600 also includes a communication interface 1617 coupled to bus 1601. The communication interface 1617 provides a two-way data communication coupling to a network link 1619 connected to a local network 1621. For example, the communication interface 1617 may be a digital subscriber line (DSL) card or modem, an integrated services digital network (ISDN) card, a cable modem, or a telephone modem to provide a data communication connection to a corresponding type of telephone line. As another example, communication interface 1617 may be a local area network (LAN) card (e.g. for Ethernet™ or an Asynchronous Transfer Model (ATM) network) to provide a data communication connection to a compatible LAN. Wireless links can also be implemented. In any such implementation, communication interface 1617 sends and receives electrical, electromagnetic, or optical signals that carry digital data streams representing various types of information. Further, the communication interface 1617 can include peripheral interface devices, such as a Universal Serial Bus (USB) interface, a PCMCIA (Personal Computer Memory Card International Association) interface, etc.

The network link 1619 typically provides data communication through one or more networks to other data devices. For example, the network link 1619 may provide a connection through local network 1621 to a host computer 1623, which has connectivity to a network 1625 (e.g. a wide area network (WAN) or the global packet data communication network now commonly referred to as the "Internet") or to data equipment operated by service provider. The local network 1621 and network 1625 both use electrical, electromagnetic, or optical signals to convey information and instructions. The signals through the various networks and the signals on network link 1619 and through communication interface 1617, which communicate digital data with computer system 1600, are exemplary forms of carrier waves bearing the information and instructions.

The computer system 1600 can send messages and receive data, including program code, through the network(s), network link 1619, and communication interface 1617. In the Internet example, a server (not shown) might transmit requested code belonging to an application program for implementing an embodiment of the present invention through the network 1625, local network 1621 and communication interface 1617. The processor 1603 may execute the transmitted code while being received and/or store the code in storage device 169, or other non-volatile storage for later execution. In this manner, computer system 1600 may obtain application code in the form of a carrier wave.

The term "computer-readable medium" as used herein refers to any medium that participates in providing instructions to the processor 1603 for execution. Such a medium may take many forms, including but not limited to non-volatile media, volatile media, and transmission media. Non-volatile media include, for example, optical or magnetic disks, such as storage device 1609. Volatile media include dynamic memory, such as main memory 1605. Transmission media include coaxial cables, copper wire and fiber optics, including the wires that comprise bus 1601. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Accordingly, the various embodiments of the present invention provide an approach for encoding structured Low Density Parity Check (LDPC) codes. Structure of the LDPC codes is provided by restricting portion part of the parity check matrix to be lower triangular and/or satisfying other requirements such that the communication between bit nodes and check nodes of the decoder is simplified. Memory storing information representing the structured parity check matrix is accessed. The information is organized in tabular form, wherein each row represents occurrences of one values within a first column of a group of columns of the parity check matrix. The rows correspond to groups of columns of the parity check matrix, wherein subsequent columns within each of the groups are derived according to a predetermined operation (e.g., cyclic shift, addition, etc.). An LDPC coded signal based on the stored information representing the parity check matrix. According to one embodiment of the present invention, a Bose Chaudhuri Hocquenghem (BCH) encoder is utilized by the transmitter to encode an input signal using BCH codes, wherein the output LDPC coded signal corresponding to the input signal represents a code having an outer BCH code and an inner LDPC code. Further, a cyclic redundancy check (CRC) encoder is supplied to encode the input signal according to a CRC code. The above approach advantageously yields reduced complexity without sacrificing performance.

While the present invention has been described in connection with a number of embodiments and implementations, the present invention is not so limited but covers various obvious modifications and equivalent arrangements, which fall within the purview of the appended claims.

What is claimed is:

1. A method of encoding, comprising:

accumulating a first information bit in a $j^{th}$ group of M information bits in an $i^{th}$ parity bit accumulator among a plurality of parity bit accumulators if the $i^{th}$ entry in $(jM)^{th}$ column of a parity check matrix is 1, where j=0, 1, 2, 3, . . . $k_{ldpc}$/M−1, wherein the parity check matrix corresponds to Low Density Parity Check (LDPC) codes;

accumulating in the parity bit accumulators the remaining (M−1) information bits m=jM+1, jM+2, jM+3, . . . , (j+1)M−1 of the $j^{th}$ group according to {x+m mod M×q}mod($n_{ldpc}$−$k_{ldpc}$), wherein x denotes the address of the parity bit accumulator corresponding to the first bit, jM, in the group, and q is a code rate dependent constant;

after all of the information bits are exhausted, performing operations, starting with i=1 are according to $p_i = p_i \oplus p_{i-1}$, i=1, 2, . . . , $n_{ldpc}$−$k_{ldpc}$−1, wherein final content of $p_i$, i=0, 1, . . . , $n_{ldpc}$−$k_{ldpc}$−1 is equal to the parity bit $p_i$; and outputting an LDPC encoded signal based on the information bits and the parity bits that are derived from the parity bit matrix.

2. A method according to claim 1, wherein the step of performing comprises:

performing a cyclic shift on the first column of each of the group.

3. A method according to claim 1, wherein the step of performing comprises:

adding a constant to the first column of each of the group, the constant being dependent on code rate of the LDPC code.

4. A method according to claim 1, wherein the parity bits are determined sequentially, the method further comprising:

determining an $i^{th}$ parity bit by adding the $(i-1)^{th}$ parity bit and the $j^{th}$ information bit if the $j^{th}$ entry in the $i^{th}$ row of the parity check matrix is 1.

5. A method according to claim 1, wherein M=360.

6. A method according to claim 1, wherein the code dependent constant q is 60, 30, 90, 45, 36, 72, 20, and 18 for code rates 2/3, 5/6, 1/2, 3/4, 4/5, 3/5, 8/9, and 9/10, respectively.

7. A method according to claim 1, further comprising:

modulating the LDPC coded signal according to a signal constellation that includes one of 8-PSK (Phase Shift Keying), 16-QAM (Quadrature Amplitude Modulation), QPSK (Quadrature Phase Shift Keying), 16-APSK (Amplitude Phase Shift Keying) and 32-APSK.

8. A method according to claim 1, further comprising:

encoding an input signal according to Bose Chaudhuri Hocquenghem (BCH) codes, wherein the output LDPC coded signal corresponding to the input signal represents a code having an outer BCH code and an inner LDPC code.

9. A method according to claim 8, wherein the number of redundant BCH bits is $n_{BCH}$−$k_{BCH}$=16*t, wherein t represents error correcting capability of the BCH code.

10. A method according to claim 8, wherein the error correction capability of the BCH code is 12 bits when used in concatenation with rate 1/2, 3/4, 4/5 and 3/5 LDPC codes, is 10 bits when used in concatenation with rate 2/3 and 5/6 LDPC codes, and is 8 bits when used in concatenation with rate 8/9 and 9/10 LDPC codes.

11. An apparatus comprising:

logic configured to accumulate a first information bit in a $j^{th}$ group of M information bits in an $i^{th}$ parity bit accumulator among a plurality of parity bit accumulators if the $i^{th}$ entry in $(jM)^{th}$ column of a parity check matrix is 1, where j=0, 1, 2, 3, . . . $k_{ldpc}$/M−1, wherein the parity check matrix corresponds to Low Density Parity Check (LDPC) codes, wherein the logic is further configured to accumulate in the parity bit accumulators the remaining (M−1) information bits m=jm+1, jM+2, jM+3, . . . , (j+1)M−1, of the $j^{th}$ group according to {x+m mod M×q}mod($n_{ldpc}$−$k_{ldpc}$), wherein x denotes the address of the parity bit accumulator corresponding to the first bit, jM, in the group, and q is a code rate dependent constant, wherein the logic is further configured to, after all of the information bits are exhausted, perform operations, starting with i=1 are according to $p_i = p_i \oplus p_{i-1}$, i=1, 2, . . . , $n_{ldpc}$−$k_{ldpc}$−1 wherein final content of $p_i$, i=0, 1, . . . , $n_{ldpc}$−$k_{ldpc}$−1 is equal to the parity bit $p_i$, wherein the logic is further configured to output an LDPC signal based on the information bits and the parity bits that are derived from the parity bit matrix.

12. An apparatus according to claim 11, wherein the logic is further configured to perform a cyclic shift on the first column of each of the group.

13. An apparatus according to claim 11, wherein the logic is further configured to add a constant to the first column of each of the group, the constant being dependent on code rate of the LDPC code.

14. An apparatus according to claim 11, wherein the parity bits are determined sequentially, the logic being further configured to determine an $i^{th}$ parity bit by adding the $(i-1)^{th}$ parity bit and the $j^{th}$ information bit if the $j^{th}$ entry in the $i^{th}$ row of the parity check matrix is 1.

15. An apparatus according to claim 11, where n M=360.

16. An apparatus according to claim 11, where n the code dependent constant q is 60, 30, 90, 45, 36, 72, 20, and 18 for code rates 2/3, 5/6, 1/2, 3/4, 4/5, 3/5, 8/9, and 9/10, respectively.

17. An apparatus according to claim 11, further comprising:

a modulator configured to modulate the LDPC coded signal according to a signal constellation that includes one of 8-PSK (Phase Shift Keying), 16-QAM (Quadrature Amplitude Modulation), QPSK (Quadrature Phase Shift Keying), 16-APSK (Amplitude Phase Shift Keying) and 32-APSK.

18. An apparatus according to claim 11, further comprising:

a Bose Chaudhuri Hocquenghem (BCH) encoder configured to encode an input signal according to codes, wherein the output LDPC coded signal corresponding to the input signal represents a code having an outer BCH code and an inner LDPC code.

19. An apparatus according to claim 18, wherein the number of redundant BCH bits is $n_{BCH}$−$k_{BCH}$=16*t, wherein t represents error correcting capability of the BCH code.

20. An apparatus according to claim 19, wherein the error correction capability of the BCH code is 12 bits when used in concatenation with rate 1/2, 3/4, 4/5 and 3/5 LDPC codes, is 10 bits when used in concatenation with rate 2/3 and 5/6 LDPC codes, and is 8 bits when used in concatenation with rate 8/9 and 9/10 LDPC codes.

21. An apparatus comprising:
a memory configured to store information representing a structured parity check matrix of Low Density Parity Check (LDPC) codes, the information being organized in tabular form, wherein each row represents occurrences of one values within a first column of a group of columns of the parity check matrix, the rows correspond to groups of columns of the parity check matrix, wherein subsequent columns within each of the groups are derived according to a predetermined operation; and
an encoder configured to output an LDPC coded signal based on information bits and parity bits that are derived from the parity bit matrix,
wherein the row indices of 1's in the column index j*360 (j=0, 1, 2, 3, . . . , $k_{ldpc}$/360−1) of the parity check matrix are given at the $j^{th}$ row according to one of Tables 1-8:

TABLE 1

Address of Parity Bit Accumulators (Rate 2/3)

0 10491 16043 506 12826 8065 8226 2767 240 18673 9279 10579 20928
1 17819 8313 6433 6224 5120 5824 12812 17187 9940 13447 13825 18483
2 17957 6024 8681 18628 12794 5915 14576 10970 12064 20437 4455 7151
3 19777 6183 9972 14536 8182 17749 11341 5556 4379 17434 15477 18532
4 4651 19689 1608 659 16707 14335 6143 3058 14618 17894 20684 5306
5 9778 2552 12096 12369 15198 16890 4851 3109 1700 18725 1997 15882
6 486 6111 13743 11537 5591 7433 15227 14145 1483 3887 17431 12430
7 20647 14311 11734 4180 8110 5525 12141 15761 18661 18441 10569 8192
8 3791 14759 15264 19918 10132 9062 10010 12786 10675 9682 19246 5454
9 19525 9485 7777 19999 8378 9209 3163 20232 6690 16518 716 7353
10 4588 6709 20202 10905 915 4317 11073 13576 16433 368 3508 21171
11 14072 4033 19959 12608 631 19494 14160 8249 10223 21504 12395 4322
12 13800 14161
13 2948 9647
14 14693 16027
15 20506 11082
16 1143 9020
17 13501 4014
18 1548 2190
19 12216 21556
20 2095 19897
21 4189 7958
22 15940 10048
23 515 12614
24 8501 8450
25 17595 16784
26 5913 8495
27 16394 10423
28 7409 6981
29 6678 15939
30 20344 12987
31 2510 14588
32 17918 6655
33 6703 19451
34 496 4217
35 7290 5766
36 10521 8925
37 20379 11905
38 4090 5838
39 19082 17040
40 20233 12352
41 19365 19546

TABLE 1-continued

Address of Parity Bit Accumulators (Rate 2/3)

42 6249 19030
43 11037 19193
44 19760 11772
45 19644 7428
46 16076 3521
47 11779 21062
48 13062 9682
49 8934 5217
50 11087 3319
51 18892 4356
52 7894 3898
53 5963 4360
54 7346 11726
55 5182 5609
56 2412 17295
57 9845 20494
58 6687 1864
59 20564 5216
0 18226 17207
1 9380 8266
2 7073 3065
3 18252 13437
4 9161 15642
5 10714 10153
6 11585 9078
7 5359 9418
8 9024 9515
9 1206 16354
10 14994 1102
11 9375 20796
12 15964 6027
13 14789 6452
14 8002 18591
15 14742 14089
16 253 3045
17 1274 19286
18 14777 2044
19 13920 9900
20 452 7374
21 18206 9921
22 6131 5414
23 10077 9726
24 12045 5479
25 4322 7990
26 15616 5550
27 15561 10661
28 20718 7387
29 2518 18804
30 8984 2600
31 6516 17909
32 11148 98
33 20559 3704
34 7510 1569
35 16000 11692
36 9147 10303
37 16650 191
38 15577 18685
39 17167 20917
40 4256 3391
41 20092 17219
42 9218 5056
43 18429 8472
44 12093 20753
45 16345 12748
46 16023 11095
47 5048 17595
48 18995 4817
49 16483 3536
50 1439 16148
51 3661 3039
52 19010 18121
53 8968 11793
54 13427 18003
55 5303 3083
56 531 16668

TABLE 1-continued

Address of Parity Bit Accumulators (Rate 2/3)

57 4771 6722
58 5695 7960
59 3589 14630

TABLE 2

Address of Parity Bit Accumulators (Rate 5/6)

0 4362 416 8909 4156 3216 3112 2560 2912 6405 8593 4969 6723
1 2479 1786 8978 3011 4339 9313 6397 2957 7288 5484 6031 10217
2 10175 9009 9889 3091 4985 7267 4092 8874 5671 2777 2189 8716
3 9052 4795 3924 3370 10058 1128 9996 10165 9360 4297 434 5138
4 2379 7834 4835 2327 9843 804 329 8353 7167 3070 1528 7311
5 3435 7871 348 3693 1876 6585 10340 7144 5870 2084 4052 2780
6 3917 3111 3476 1304 10331 5939 5199 1611 1991 699 8316 9960
7 6883 3237 1717 10752 7891 9764 4745 3888 10009 4176 4614 1567
8 10587 2195 1689 2968 5420 2580 2883 6496 111 6023 1024 4449
9 3786 8593 2074 3321 5057 1450 3840 5444 6572 3094 9892 1512
10 8548 1848 10372 4585 7313 6536 6379 1766 9462 2456 5606 9975
11 8204 10593 7935 3636 3882 394 5968 8561 2395 7289 9267 9978
12 7795 74 1633 9542 6867 7352 6417 7568 10623 725 2531 9115
13 7151 2482 4260 5003 10105 7419 9203 6691 8798 2092 8263 3755
14 3600 570 4527 200 9718 6771 1995 8902 5446 768 1103 6520
15 6304 7621
16 6498 9209
17 7293 6786
18 5950 1708
19 8521 1793
20 6174 7854
21 9773 1190
22 9517 10268
23 2181 9349
24 1949 5560
25 1556 555
26 8600 3827
27 5072 1057
28 7928 3542
29 3226 3762
0 7045 2420
1 9645 2641
2 2774 2452
3 5331 2031
4 9400 7503
5 1850 2338
6 10456 9774
7 1692 9276
8 10037 4038
9 3964 338
10 2640 5087
11 858 3473
12 5582 5683
13 9523 916
14 4107 1559
15 4506 3491
16 8191 4182
17 10192 6157
18 5668 3305
19 3449 1540
20 4766 2697
21 4069 6675
22 1117 1016
23 5619 3085
24 8483 8400
25 8255 394
26 6338 5042
27 6174 5119
28 7203 1989
29 1781 5174
0 1464 3559
1 3376 4214
2 7238 67
3 10595 8831
4 1221 6513
5 5300 4652

TABLE 2-continued

Address of Parity Bit Accumulators (Rate 5/6)

6 1429 9749
7 7878 5131
8 4435 10284
9 6331 5507
10 6662 4941
11 9614 10238
12 8400 8025
13 9156 5630
14 7067 8878
15 9027 3415
16 1690 3866
17 2854 8469
18 6206 630
19 363 5453
20 4125 7008
21 1612 6702
22 9069 9226
23 5767 4060
24 3743 9237
25 7018 5572
26 8892 4536
27 853 6064
28 8069 5893
29 2051 2885
0 10691 3153
1 3602 4055
2 328 1717
3 2219 9299
4 1939 7898
5 617 206
6 8544 1374
7 10676 3240
8 6672 9489
9 3170 7457
10 7868 5731
11 6121 10732
12 4843 9132
13 580 9591
14 6267 9290
15 3009 2268
16 195 2419
17 8016 1557
18 1516 9195
19 8062 9064
20 2095 8968
21 753 7326
22 6291 3833
23 2614 7844
24 2303 646
25 2075 611
26 4687 362
27 8684 9940
28 4830 2065
29 7038 1363
0 1769 7837
1 3801 1689
2 10070 2359
3 3667 9918
4 1914 6920
5 4244 5669
6 10245 7821
7 7648 3944
8 3310 5488
9 6346 9666
10 7088 6122
11 1291 7827
12 10592 8945
13 3609 7120
14 9168 9112
15 6203 8052
16 3330 2895
17 4264 10563
18 10556 6496
19 8807 7645
20 1999 4530
21 9202 6818
22 3403 1734

TABLE 2-continued

Address of Parity Bit Accumulators (Rate 5/6)

23 2106 9023
24 6881 3883
25 3895 2171
26 4062 6424
27 3755 9536
28 4683 2131
29 7347 8027

TABLE 3

Address of Parity Bit Accumulators (Rate 1/2)

54 9318 14392 27561 26909 10219 2534 8597
55 7263 4635 2530 28130 3033 23830 3651
56 24731 23583 26036 17299 5750 792 9169
57 5811 26154 18653 11551 15447 13685 16264
58 12610 11347 28768 2792 3174 29371 12997
59 16789 16018 21449 6165 21202 15850 3186
60 31016 21449 17618 6213 12166 8334 18212
61 22836 14213 11327 5896 718 11727 9308
62 2091 24941 29966 23634 9013 15587 5444
63 22207 3983 16904 28534 21415 27524 25912
64 25687 4501 22193 14665 14798 16158 5491
65 4520 17094 23397 4264 22370 16941 21526
66 10490 6182 32370 9597 30841 25954 2762
67 22120 22865 29870 15147 13668 14955 19235
68 6689 18408 18346 9918 25746 5443 20645
69 29982 12529 13858 4746 30370 10023 24828
70 1262 28032 29888 13063 24033 21951 7863
71 6594 29642 31451 14831 9509 9335 31552
72 1358 6454 16633 20354 24598 624 5265
73 19529 295 18011 3080 13364 8032 15323
74 11981 1510 7960 21462 9129 11370 25741
75 9276 29656 4543 30699 20646 21921 28050
76 15975 25634 5520 31119 13715 21949 19605
77 18688 4608 31755 30165 13103 10706 29224
78 21514 23117 12245 26035 31656 25631 30699
79 9674 24966 31285 29908 17042 24588 31857
80 21856 27777 29919 27000 14897 11409 7122
81 29773 23310 263 4877 28622 20545 22092
82 15605 5651 21864 3967 14419 22757 15896
83 30145 1759 10139 29223 26086 10556 5098
84 18815 16575 2936 24457 26738 6030 505
85 30326 22298 27562 20131 26390 6247 24791
86 928 29246 21246 12400 15311 32309 18608
87 20314 6025 26689 16302 2296 3244 19613
88 6237 11943 22851 15642 23857 15112 20947
89 26403 25168 19038 18384 8882 12719 7093
0 14567 24965
1 3908 100
2 10279 240
3 24102 764
4 12383 4173
5 13861 15918
6 21327 1046
7 5288 14579
8 28158 8069
9 16583 11098
10 16681 28363
11 13980 24725
12 32169 17989
13 10907 2767
14 21557 3818
15 26676 12422
16 7676 8754
17 14905 20232
18 15719 24646
19 31942 8589
20 19978 27197
21 27060 15071
22 6071 26649
23 10393 11176
24 9597 13370
25 7081 17677

TABLE 3-continued

Address of Parity Bit Accumulators (Rate 1/2)

26 1433 19513
27 26925 9014
28 19202 8900
29 18152 30647
30 20803 1737
31 11804 25221
32 31683 17783
33 29694 9345
34 12280 26611
35 6526 26122
36 26165 11241
37 7666 26962
38 16290 8480
39 11774 10120
40 30051 30426
41 1335 15424
42 6865 17742
43 31779 12489
44 32120 21001
45 14508 6996
46 979 25024
47 4554 21896
48 7989 21777
49 4972 20661
50 6612 2730
51 12742 4418
52 29194 595
53 19267 20113

TABLE 4

Address of Parity Bit Accumulators (Rate 3/4)

0 6385 7901 14611 13389 11200 3252 5243 2504 2722 821 7374
1 11359 2698 357 13824 12772 7244 6752 15310 852 2001 11417
2 7862 7977 6321 13612 12197 14449 15137 13860 1708 6399 13444
3 1560 11804 6975 13292 3646 3812 8772 7306 5795 14327 7866
4 7626 11407 14599 9689 1628 2113 10809 9283 1230 15241 4870
5 1610 5699 15876 9446 12515 1400 6303 5411 14181 13925 7358
6 4059 8836 3405 7853 7992 15336 5970 10368 10278 9675 4651
7 4441 3963 9153 2109 12683 7459 12030 12221 629 15212 406
8 6007 8411 5771 3497 543 14202 875 9186 6235 13908 3563
9 3232 6625 4795 546 9781 2071 7312 3399 7250 4932 12652
10 8820 10088 11090 7069 6585 13134 10158 7183 488 7455 9238
11 1903 10818 119 215 7558 11046 10615 11545 14784 7961 15619
12 3655 8736 4917 15874 5129 2134 15944 14768 7150 2692 1469
13 8316 3820 505 8923 6757 806 7957 4216 15589 13244 2622
14 14463 4852 15733 3041 11193 12860 13673 8152 6551 15108 8758
15 3149 11981
16 13416 6906
17 13098 13352
18 2009 14460
19 7207 4314
20 3312 3945
21 4418 6248
22 2669 13975
23 7571 9023
24 14172 2967
25 7271 7138
26 6135 13670
27 7490 14559
28 8657 2466
29 8599 12834
30 3470 3152
31 13917 4365
32 6024 13730
33 10973 14182
34 2464 13167
35 5281 15049
36 1103 1849
37 2058 1069
38 9654 6095
39 14311 7667
40 15617 8146

TABLE 4-continued

Address of Parity Bit Accumulators (Rate ¾)

41 4588 11218
42 13660 6243
43 8578 7874
44 11741 2686
0 1022 1264
1 12604 9965
2 8217 2707
3 3156 11793
4 354 1514
5 6978 14058
6 7922 16079
7 15087 12138
8 5053 6470
9 12687 14932
10 15458 1763
11 8121 1721
12 12431 549
13 4129 7091
14 1426 8415
15 9783 7604
16 6295 11329
17 1409 12061
18 8065 9087
19 2918 8438
20 1293 14115
21 3922 13851
22 3851 4000
23 5865 1768
24 2655 14957
25 5565 6332
26 4303 12631
27 11653 12236
28 16025 7632
29 4655 14128
30 9584 13123
31 13987 9597
32 15409 12110
33 8754 15490
34 7416 15325
35 2909 15549
36 2995 8257
37 9406 4791
38 11111 4854
39 2812 8521
40 8476 14717
41 7820 15360
42 1179 7939
43 2357 8678
44 7703 6216
0 3477 7067
1 3931 13845
2 7675 12899
3 1754 8187
4 7785 1400
5 9213 5891
6 2494 7703
7 2576 7902
8 4821 15682
9 10426 11935
10 1810 904
11 11332 9264
12 11312 3570
13 14916 2650
14 7679 7842
15 6089 13084
16 3938 2751
17 8509 4648
18 12204 8917
19 5749 12443
20 12613 4431
21 1344 4014
22 8488 13850
23 1730 14896
24 14942 7126
25 14983 8863
26 6578 8564
27 4947 396

TABLE 4-continued

Address of Parity Bit Accumulators (Rate ¾)

28 297 12805
29 13878 6692
30 11857 11186
31 14395 11493
32 16145 12251
33 13462 7428
34 14526 13119
35 2535 11243
36 6465 12690
37 6872 9334
38 15371 14023
39 8101 10187
40 11963 4848
41 15125 6119
42 8051 14465
43 11139 5167
44 2883 14521

TABLE 5

Address of Parity Bit Accumulators (Rate ⅘)

0 149 11212 5575 6360 12559 8108 8505 408 10026 12828
1 5237 490 10677 4998 3869 3734 3092 3509 7703 10305
2 8742 5553 2820 7085 12116 10485 564 7795 2972 2157
3 2699 4304 8350 712 2841 3250 4731 10105 517 7516
4 12067 1351 11992 12191 11267 5161 537 6166 4246 2363
5 6828 7107 2127 3724 5743 11040 10756 4073 1011 3422
6 11259 1216 9526 1466 10816 940 3744 2815 11506 11573
7 4549 11507 1118 1274 11751 5207 7854 12803 4047 6484
8 8430 4115 9440 413 4455 2262 7915 12402 8579 7052
9 3885 9126 5665 4505 2343 253 4707 3742 4166 1556
10 1704 8936 6775 8639 8179 7954 8234 7850 8883 8713
11 11716 4344 9087 11264 2274 8832 9147 11930 6054 5455
12 7323 3970 10329 2170 8262 3854 2087 12899 9497 11700
13 4418 1467 2490 5841 817 11453 533 11217 11962 5251
14 1541 4525 7976 3457 9536 7725 3788 2982 6307 5997
15 11484 2739 4023 12107 6516 551 2572 6628 8150 9852
16 6070 1761 4627 6534 7913 3730 11866 1813 12306 8249
17 12441 5489 8748 7837 7660 2102 11341 2936 6712 11977
18 10155 4210
19 1010 10483
20 8900 10250
21 10243 12278
22 7070 4397
23 12271 3887
24 11980 6836
25 9514 4356
26 7137 10281
27 11881 2526
28 1969 11477
29 3044 10921
30 2236 8724
31 9104 6340
32 7342 8582
33 11675 10405
34 6467 12775
35 3186 12198
0 9621 11445
1 7486 5611
2 4319 4879
3 2196 344
4 7527 6650
5 10693 2440
6 6755 2706
7 5144 5998
8 11043 8033
9 4846 4435
10 4157 9228
11 12270 6562
12 11954 7592
13 7420 2592
14 8810 9636
15 689 5430

TABLE 5-continued

Address of Parity Bit Accumulators (Rate 4/5)

16 920 1304
17 1253 11934
18 9559 6016
19 312 7589
20 4439 4197
21 4002 9555
22 12232 7779
23 1494 8782
24 10749 3969
25 4368 3479
26 6316 5342
27 2455 3493
28 12157 7405
29 6598 11495
30 11805 4455
31 9625 2090
32 4731 2321
33 3578 2608
34 8504 1849
35 4027 1151
0 5647 4935
1 4219 1870
2 10968 8054
3 6970 5447
4 3217 5638
5 8972 669
6 5618 12472
7 1457 1280
8 8868 3883
9 8866 1224
10 8371 5972
11 266 4405
12 3706 3244
13 6039 5844
14 7200 3283
15 1502 11282
16 12318 2202
17 4523 965
18 9587 7011
19 2552 2051
20 12045 10306
21 11070 5104
22 6627 6906
23 9889 2121
24 829 9701
25 2201 1819
26 6689 12925
27 2139 8757
28 12004 5948
29 8704 3191
30 8171 10933
31 6297 7116
32 616 7146
33 5142 9761
34 10377 8138
35 7616 5811
0 7285 9863
1 7764 10867
2 12343 9019
3 4414 8331
4 3464 642
5 6960 2039
6 786 3021
7 710 2086
8 7423 5601
9 8120 4885
10 12385 11990
11 9739 10034
12 424 10162
13 1347 7597
14 1450 112
15 7965 8478
16 8945 7397
17 6590 8316
18 6838 9011
19 6174 9410
20 255 113

TABLE 5-continued

Address of Parity Bit Accumulators (Rate 4/5)

21 6197 5835
22 12902 3844
23 4377 3505
24 5478 8672
25 4453 2132
26 9724 1380
27 12131 11526
28 12323 9511
29 8231 1752
30 497 9022
31 9288 3080
32 2481 7515
33 2696 268
34 4023 12341
35 7108 5553

TABLE 6

Address of Parity Bit Accumulators (Rate 3/5)

22422 10282 11626 19997 11161 2922 3122 99 5625 17064 8270 179
25087 16218 17015 828 20041 25656 4186 11629 22599 17305 22515
6463 11049 22853 25706 14388 5500 19245 8732 2177 13555 11346
17265 3069 16581 22225 12563 19717 23577 11555 25496 6853 25403
5218 15925 21766 16529 14487 7643 10715 17442 11119 5679 14155
24213 21000 1116 15620 5340 8636 16693 1434 5635 6516 9482 20189
1066 15013 25361 14243 18506 22236 20912 8952 5421 15691 6126
21595 500 6904 13059 6802 8433 4694 5524 14216 3685 19721 25420
9937 23813 9047 25651 16826 21500 24814 6344 17382 7064 13929
4004 16552 12818 8720 5286 2206 22517 2429 19065 2921 21611 1873
7507 5661 23006 23128 20543 19777 1770 4636 20900 14931 9247
12340 11008 12966 4471 2731 16445 791 6635 14556 18865 22421
22124 12697 9803 25485 7744 18254 11313 9004 19982 23963 18912
7206 12500 4382 20067 6177 21007 1195 23547 24837 756 11158 14646
20534 3647 17728 11676 11843 12937 4402 8261 22944 9306 24009
10012 11081 3746 24325 8060 19826 842 8836 2898 5019 7575 7455
25244 4736 14400 22981 5543 8006 24203 13053 1120 5128 3482 9270
13059 15825 7453 23747 3656 24585 16542 17507 22462 14670 15627
15290 4198 22748 5842 13395 23918 16985 14929 3726 25350 24157
24896 16365 16423 13461 16615 8107 24741 3604 25904 8716 9604
20365 3729 17245 18448 9862 20831 25326 20517 24618 13282 5099
14183 8804 16455 17646 15376 18194 25528 1777 6066 21855 14372
12517 4488 17490 1400 8135 23375 20879 8476 4084 12936 25536
22309 16582 6402 24360 25119 23586 128 4761 10443 22536 8607 9752
25446 15053 1856 4040 377 21160 13474 5451 17170 5938 10256 11972
24210 17833 22047 16108 13075 9648 24546 13150 23867 7309 19798
2988 16858 4825 23950 15125 20526 3553 11525 23366 2452 17626
19265 20172 18060 24593 13255 1552 18839 21132 20119 15214 14705
7096 10174 5663 18651 19700 12524 14033 4127 2971 17499 16287
22368 21463 7943 18880 5567 8047 23363 6797 10651 24471 14325
4081 7258 4949 7044 1078 797 22910 20474 4318 21374 13231 22985
5056 3821 23718 14178 9978 19030 23594 8895 25358 6199 22056 7749
13310 3999 23697 16445 22636 5225 22437 24153 9442 7978 12177
2893 20778 3175 8645 11863 24623 10311 25767 17057 3691 20473
11294 9914 22815 2574 8439 3699 5431 24840 21908 16088 18244 8208
5755 19059 8541 24924 6454 11234 10492 16406 10831 11436 9649
16264 11275 24953 2347 12667 19190 7257 7174 24819 2938 2522
11749 3627 5969 13862 1538 23176 6353 2855 17720 2472 7428 573
15036
0 18539 18661
1 10502 3002
2 9368 10761
3 12299 7828
4 15048 13362
5 18444 24640
6 20775 19175
7 18970 10971
8 5329 19982
9 11296 18655
10 15046 20659
11 7300 22140
12 22029 14477
13 11129 742
14 13254 13813

TABLE 6-continued

Address of Parity Bit Accumulators (Rate ⅗)

15 19234 13273
16 6079 21122
17 22782 5828
18 19775 4247
19 1660 19413
20 4403 3649
21 13371 25851
22 22770 21784
23 10757 14131
24 16071 21617
25 6393 3725
26 597 19968
27 5743 8084
28 6770 9548
29 4285 17542
30 13568 22599
31 1786 4617
32 23238 11648
33 19627 2030
34 13601 13458
35 13740 17328
36 25012 13944
37 22513 6687
38 4934 12587
39 21197 5133
40 22705 6938
41 7534 24633
42 24400 12797
43 21911 25712
44 12039 1140
45 24306 1021
46 14012 20747
47 11265 15219
48 4670 15531
49 9417 14359
50 2415 6504
51 24964 24690
52 14443 8816
53 6926 1291
54 6209 20806
55 13915 4079
56 24410 13196
57 13505 6117
58 9869 8220
59 1570 6044
60 25780 17387
61 20671 24913
62 24558 20591
63 12402 3702
64 8314 1357
65 20071 14616
66 17014 3688
67 19837 946
68 15195 12136
69 7758 22808
70 3564 2925
71 3434 7769

TABLE 7

Address of Parity Bit Accumulators (Rate ⅔)

0 6235 2848 3222
1 5800 3492 5348
2 2757 927 90
3 6961 4516 4739
4 1172 3237 6264
5 1927 2425 3683
6 3714 6309 2495
7 3070 6342 7154
8 2428 613 3761
9 2906 264 5927
10 1716 1950 4273
11 4613 6179 3491

TABLE 7-continued

Address of Parity Bit Accumulators (Rate ⅔)

12 4865 3286 6005
13 1343 5923 3529
14 4589 4035 2132
15 1579 3920 6737
16 1644 1191 5998
17 1482 2381 4620
18 6791 6014 6596
19 2738 5918 3786
0 5156 6166
1 1504 4356
2 130 1904
3 6027 3187
4 6718 759
5 6240 2870
6 2343 1311
7 1039 5465
8 6617 2513
9 1588 5222
10 6561 535
11 4765 2054
12 5966 6892
13 1969 3869
14 3571 2420
15 4632 981
16 3215 4163
17 973 3117
18 3802 6198
19 3794 3948
0 3196 6126
1 573 1909
2 850 4034
3 5622 1601
4 6005 524
5 5251 5783
6 172 2032
7 1875 2475
8 497 1291
9 2566 3430
10 1249 740
11 2944 1948
12 6528 2899
13 2243 3616
14 867 3733
15 1374 4702
16 4698 2285
17 4760 3917
18 1859 4058
19 6141 3527
0 2148 5066
1 1306 145
2 2319 871
3 3463 1061
4 5554 6647
5 5837 339
6 5821 4932
7 6356 4756
8 3930 418
9 211 3094
10 1007 4928
11 3584 1235
12 6982 2869
13 1612 1013
14 953 4964
15 4555 4410
16 4925 4842
17 5778 600
18 6509 2417
19 1260 4903
0 3369 3031
1 3557 3224
2 3028 583
3 3258 440
4 6226 6655
5 4895 1094
6 1481 6847
7 4433 1932
8 2107 1649

TABLE 7-continued

Address of Parity Bit Accumulators (Rate ⅚)

9 2119 2065
10 4003 6388
11 6720 3622
12 3694 4521
13 1164 7050
14 1965 3613
15 4331 66
16 2970 1796
17 4652 3218
18 1762 4777
19 5736 1399
0 970 2572
1 2062 6599
2 4597 4870
3 1228 6913
4 4159 1037
5 2916 2362
6 395 1226
7 6911 4548
8 4618 2241
9 4120 4280
10 5825 474
11 2154 5558
12 3793 5471
13 5707 1595
14 1403 325
15 6601 5183
16 6369 4569
17 4846 896
18 7092 6184
19 6764 7127
0 6358 1951
1 3117 6960
2 2710 7062
3 1133 3604
4 3694 657
5 1355 110
6 3329 6736
7 2505 3407
8 2462 4806
9 4216 214
10 5348 5619
11 6627 6243
12 2644 5073
13 4212 5088
14 3463 3889
15 5306 478
16 4320 6121
17 3961 1125
18 5699 1195
19 6511 792
0 3934 2778
1 3238 6587
2 1111 6596
3 1457 6226
4 1446 3885
5 3907 4043
6 6839 2873
7 1733 5615
8 5202 4269
9 3024 4722
10 5445 6372
11 370 1828
12 4695 1600
13 680 2074
14 1801 6690
15 2669 1377
16 2463 1681
17 5972 5171
18 5728 4284
19 1696 1459

TABLE 8

Address of Parity Bit Accumulators (Rate 9/10)

0 5611 2563 2900
1 5220 3143 4813
2 2481 834 81
3 6265 4064 4265
4 1055 2914 5638
5 1734 2182 3315
6 3342 5678 2246
7 2185 552 3385
8 2615 236 5334
9 1546 1755 3846
10 4154 5561 3142
11 4382 2957 5400
12 1209 5329 3179
13 1421 3528 6063
14 1480 1072 5398
15 3843 1777 4369
16 1334 2145 4163
17 2368 5055 260
0 6118 5405
1 2994 4370
2 3405 1669
3 4640 5550
4 1354 3921
5 117 1713
6 5425 2866
7 6047 683
8 5616 2582
9 2108 1179
10 933 4921
11 5953 2261
12 1430 4699
13 5905 480
14 4289 1846
15 5374 6208
16 1775 3476
17 3216 2178
0 4165 884
1 2896 3744
2 874 2801
3 3423 5579
4 3404 3552
5 2876 5515
6 516 1719
7 765 3631
8 5059 1441
9 5629 598
10 5405 473
11 4724 5210
12 155 1832
13 1689 2229
14 449 1164
15 2308 3088
16 1122 669
17 2268 5758
0 5878 2609
1 782 3359
2 1231 4231
3 4225 2052
4 4286 3517
5 5531 3184
6 1935 4560
7 1174 131
8 3115 956
9 3129 1088
10 5238 4440
11 5722 4280
12 3540 375
13 191 2782
14 906 4432
15 3225 1111
16 6296 2583
17 1457 903
0 855 4475
1 4097 3970
2 4433 4361
3 5198 541
4 1146 4426

TABLE 8-continued

Address of Parity Bit Accumulators (Rate 9/10)

5 3202 2902
6 2724 525
7 1083 4124
8 2326 6003
9 5605 5990
10 4376 1579
11 4407 984
12 1332 6163
13 5359 3975
14 1907 1854
15 3601 5748
16 6056 3266
17 3322 4085
0 1768 3244
1 2149 144
2 1589 4291
3 5154 1252
4 1855 5939
5 4820 2706
6 1475 3360
7 4266 693
8 4156 2018
9 2103 752
10 3710 3853
11 5123 931
12 6146 3323
13 1939 5002
14 5140 1437
15 1263 293
16 5949 4665
17 4548 6380
0 3171 4690
1 5204 2114
2 6384 5565
3 5722 1757
4 2805 6264
5 1202 2616
6 1018 3244
7 4018 5289
8 2257 3067
9 2483 3073
10 1196 5329
11 649 3918
12 3791 4581
13 5028 3803
14 3119 3506
15 4779 431
16 3888 5510
17 4387 4084
0 5836 1692
1 5126 1078
2 5721 6165
3 3540 2499

TABLE 8-continued

Address of Parity Bit Accumulators (Rate 9/10)

4 2225 6348
5 1044 1484
6 6323 4042
7 1313 5603
8 1303 3496
9 3516 3639
10 5161 2293
11 4682 3845
12 3045 643
13 2818 2616
14 3267 649
15 6236 593
16 646 2948
17 4213 1442
0 5779 1596
1 2403 1237
2 2217 1514
3 5609 716
4 5155 3858
5 1517 1312
6 2554 3158
7 5280 2643
8 4990 1353
9 5648 1170
10 1152 4366
11 3561 5368
12 3581 1411
13 5647 4661
14 1542 5401
15 5078 2687
16 316 1755
17 3392 1991.

22. An apparatus according to claim 21, wherein the row indices of 1's in other column indices m (m modulo 360≠0 and m<$k_{ldpc}$) of the parity check matrix are given by {x+m mod 360×q}mod($n_{ldpc}$−$k_{ldpc}$), where q=60 for rate 2/3 LDPC code, q=30 for rate 5/6 LDPC code, q=90 for rate 1/2 LDPC code, q=45 for rate 3/4 LDPC code, q=36 for rate 4/5 LDPC code, q=72 for rate 3/5 LDPC code, q=20 for rate 8/9 LDPC code, q=18 for rate 9/10 LDPC code, wherein x denotes an entry at the $j^{th}$ row of Tables 1-8, where j=int{m/360}, and int{.}denotes the integer function, the row indices of 1's in the column index m=$k_{ldpc}$+j(j=0, 1, 2, . . . , $n_{ldpc}$−$k_{ldpc}$−2) of the parity check matrix being given by j and j+1, the row index of 1 in the column index $n_{ldpc}$−1 of the parity check matrix being given by $n_{ldpc}$−$k_{ldpc}$−1.

* * * * *